United States Patent
Lin

(10) Patent No.: US 9,051,473 B2
(45) Date of Patent: Jun. 9, 2015

(54) CLEAR COATING COMPOSITIONS COMPRISING DISPERSED SILICA NONO-PARTICLES AND PROCESSES FOR USING

(75) Inventor: Jun Lin, Troy, MI (US)

(73) Assignee: AXALTA COATING SYSTEMS IP CO., LLC, Wilmington, DE (US)

( * ) Notice: Subject to any disclaimer, the term of this patent is extended or adjusted under 35 U.S.C. 154(b) by 1152 days.

(21) Appl. No.: 11/818,456

(22) Filed: Jun. 14, 2007

(65) Prior Publication Data

US 2007/0292623 A1 Dec. 20, 2007

Related U.S. Application Data

(60) Provisional application No. 60/813,725, filed on Jun. 14, 2006, provisional application No. 60/858,852, filed on Nov. 14, 2006.

(51) Int. Cl.
| | |
|---|---|
| *A23F 3/34* | (2006.01) |
| *B05D 7/00* | (2006.01) |
| *C09D 1/00* | (2006.01) |
| *C09D 201/00* | (2006.01) |
| *C08K 3/36* | (2006.01) |
| *C08K 9/06* | (2006.01) |
| *H05K 3/28* | (2006.01) |

(52) U.S. Cl.
CPC ... *C09D 1/00* (2013.01); *C08K 3/36* (2013.01); *C08K 9/06* (2013.01); *H05K 3/285* (2013.01); *C09D 201/005* (2013.01)

(58) Field of Classification Search
CPC .................................... C09D 1/00; C08K 3/36
USPC ............... 427/219, 220, 407.1, 444; 428/323, 428/327, 447, 461; 523/300, 216; 524/226, 524/268, 430, 431, 437, 492, 493, 588, 524/838; 525/100, 446, 474; 556/423
See application file for complete search history.

(56) References Cited

U.S. PATENT DOCUMENTS

| | | | |
|---|---|---|---|
| 3,585,160 A | 6/1971 | Miller et al. | |
| 4,242,243 A | 12/1980 | Antonelli et al. | |
| RE31,309 E | 7/1983 | Antonelli et al. | |
| 4,508,880 A | 4/1985 | Webster | |
| 4,659,780 A | 4/1987 | Stamegna et al. | |
| 4,692,481 A | 9/1987 | Kelly | |
| 5,244,696 A | 9/1993 | Hazan et al. | |
| 5,378,790 A | 1/1995 | Michalczyk et al. | |
| 5,548,051 A | 8/1996 | Michalczyk et al. | |
| 5,681,622 A * | 10/1997 | Vogt-Birnbrich et al. | 427/407.1 |
| 5,853,809 A | 12/1998 | Campbell et al. | |
| 5,866,259 A | 2/1999 | Harris et al. | |
| 6,140,445 A * | 10/2000 | Su et al. | 528/15 |
| 6,146,703 A | 11/2000 | Barsotti et al. | |
| 6,221,484 B1 | 4/2001 | Leiter | |
| 6,268,456 B1 | 7/2001 | Gregorovich et al. | |
| 6,271,340 B1 | 8/2001 | Anderson et al. | |
| 6,329,489 B1 * | 12/2001 | Gregorovich et al. | 528/29 |
| 6,379,807 B1 | 4/2002 | Nordstrom et al. | |
| 6,387,519 B1 | 5/2002 | Anderson et al. | |
| 6,428,898 B1 * | 8/2002 | Barsotti et al. | 428/447 |
| 6,451,950 B1 | 9/2002 | Ma | |
| 6,462,125 B1 | 10/2002 | White et al. | |
| 6,462,144 B1 | 10/2002 | Ramesh et al. | |
| 6,472,463 B1 | 10/2002 | Ma | |
| 6,605,669 B2 | 8/2003 | Awokola et al. | |
| 6,740,365 B2 | 5/2004 | Awokola et al. | |
| 6,743,867 B1 | 6/2004 | Flosbach et al. | |
| 6,759,478 B2 | 7/2004 | Anderson et al. | |
| 6,905,765 B2 | 6/2005 | Sunkara | |
| 2002/0173384 A1 * | 11/2002 | Hogge et al. | 473/378 |
| 2003/0050388 A1 | 3/2003 | Strickland et al. | |
| 2003/0224174 A1 * | 12/2003 | White et al. | 428/413 |
| 2004/0010091 A1 | 1/2004 | Paquet, Jr. et al. | |
| 2005/0113489 A1 * | 5/2005 | Baran et al. | 523/300 |
| 2006/0100350 A1 | 5/2006 | Barsotti et al. | |
| 2006/0100351 A1 | 5/2006 | Butera et al. | |

FOREIGN PATENT DOCUMENTS

| | | |
|---|---|---|
| EP | 1 054 916 B1 | 11/2000 |
| WO | WO 03/070843 A1 | 8/2003 |

OTHER PUBLICATIONS

Silquest A-186 Silane and Silquest A-187 Silane. (Apr. 2002) Crompton Corporation. Online at: http://www.biryong.co.kr/datacenter/chemistry/silquesta186and187.pdf.*

* cited by examiner

*Primary Examiner* — Ling Choi
*Assistant Examiner* — Thuy-Al Nguyen
(74) *Attorney, Agent, or Firm* — Ingrassia Fisher & Lorenz, P.C.

(57) ABSTRACT

Disclosed herein is a clear coating composition comprising a dispersion of silica nano-particles prepared from silica nano-particles having reactive silane groups of 1-500 nm particle size, and at least 0.001 parts by weight of oligomer having at least two groups reactive with the silica nano-particles, or oligomer in combination with a film forming polymer, a low molecular weight coupling agent, or a combination of a film forming polymer and a low molecular weight coupling agent.

14 Claims, No Drawings

CLEAR COATING COMPOSITIONS COMPRISING DISPERSED SILICA NONO-PARTICLES AND PROCESSES FOR USING

CROSS-REFERENCE TO RELATED APPLICATION

This application claims the benefit U.S. Provisional Application Ser. No. 60/813,725 filed on Jun. 14, 2006 and U.S. Provisional Application 60/858,852 filed on Nov. 14, 2006, which are hereby incorporated by reference in its entirety.

FIELD OF THE INVENTION

This invention relates to a clear coating compositions of dispersed silica nano-particles 1-500 nm particle size. The compositions of the present invention are useful in providing a clear coat to a substrate, and in particular to automobile and truck substrates.

BACKGROUND OF THE INVENTION

Basecoat/clearcoat (pigmented coating overlaid with a clearcoat layer) finishes for vehicles, such as, automobiles and trucks, are currently being widely used. Typically, such finishes are produced by a wet-on-wet method. In the method for applying a basecoat/clear coat finish, a basecoat (commonly referred to as a color coat) containing color pigment and/or special effect imparting pigment, is applied and flash dried for a short period of time, but not cured. Then the clear coating composition, which provides protection for the color coat and improves the gloss, distinctness of image and overall appearance of the finish, is applied thereover and both the color coat and the clearcoat are cured together. Optionally, the basecoat can be dried and cured before application of the clear coat.

Scratching and marring of the clearcoat finish continues to be a problem for vehicle finishes, particularly, wet scratch and mar resistance of such finishes. Clearcoat finishes on automotive vehicles are often subjected to mechanical damage caused by a variety of events during normal use. For example, materials that come in contact with the clear coats under normal use on the roadways, such as stones, sand, metal objects and the like, cause chipping of the clear coat finish. Keys used to lock and unlock vehicle doors cause scratches of the finish. Automated car wash equipment and brushes cause marring and scratching of the clear coat finish. The placement of sliding objects on the surface of an automotive vehicle such as the top of a trunk or hood causes scratches and marring. Also, the clear coat finish is subject to environmental damage caused, for example, by acid rain and exposure to UV light.

Attempts have been made to solve these problems by the addition of finely divided hard materials, such as silica, to the clearcoating composition. However, such particles often cause the resulting finish to have a dull appearance and reduced transparency, which are unacceptable appearance properties for automobiles and trucks. In Campbell et al. U.S. Pat. No. 5,853,809, inorganic microparticles were incorporated into a coating composition using an agent that reacted with the microparticles and with the crosslinking agent which resulted in relatively uniform distribution of the microparticles in the final cured clear coat finish. However, this did not significantly improve scratch and mar resistance of the clear coat finish and in some cases significantly reduced the transparency of the finish.

In Anderson et al. U.S. Pat. Nos. 6,759,478 and 6,387,519, clear coating compositions were formed with inorganic microparticles, which resulted in clear coat finishes on curing that had a stratified layer of microparticles at or near the surface of the finish which improved scratch and mar resistance. However, when the stratified layer is worn through or penetrated by damage caused, for example, by automatic car washing or exposure to the elements, the scratch and mar resistance performance of the finish deteriorates significantly.

There is a need for a clear transparent vehicle finish that has enhanced scratch and mar resistance, particularly under wet conditions and that has an excellent appearance and good optical properties. Automobiles and trucks having a finish of this invention have an acceptable automotive quality appearance and are resistant to both mechanical abrasion under wet conditions and to degradation by exposure to the elements.

SUMMARY OF THE INVENTION

In one aspect the present invention is a clear coating composition comprising a dispersion of silica nano-particles, wherein the coating composition comprises
  a) a film forming polymer having at least one reactive group selected from the group consisting of hydroxyl, isocyanate, carbamate, silane, hydroxyl silane, alkoxy silane, epoxy, carboxyl, free radically polymerizable ethylenically unsaturated group or a combination thereof;
  b) at least one crosslinking agent that is reactive with the film forming polymer;
  c) an organic liquid carrier; and
  d) 0.1 to 20 percent by weight, based on the weight of the film forming polymer, of dispersed silica nano-particles;
  wherein the silica nano-particles have a particle size of 1-500 nm and are dispersed with at least 0.001 parts by weight, based on the weight of the silica nano-particles, of a dispersing agent, the dispersing agent comprising:
    (i) a branched oligomer having at least two reactive groups being reactive with the silica nano-particles; or
    (ii) a mixture of said oligomer of part (i) with (1) a low molecular weight coupling agent, (2) said film-forming polymer, or (3) a combination thereof;
  whereby upon curing of the coating composition, silica nano-particle agglomerates are formed having a particle size of from 10 to 5000 nm.

In another aspect the present invention is a substrate coated with a coating composition the coating composition comprising a dispersion of silica nano-particles, wherein the coating composition comprises
  a) a film forming polymer having at least one reactive group selected from the group consisting of hydroxyl, isocyanate, carbamate, silane, hydroxyl silane, alkoxy silane, epoxy, carboxyl, free radically polymerizable ethylenically unsaturated group or a combination thereof;
  b) at least one crosslinking agent that is reactive with the film forming polymer;
  c) an organic liquid carrier; and
  d) 0.1 to 20 percent by weight, based on the weight of the film forming polymer, of dispersed silica nano-particles;
  wherein the silica nano-particles have a particle size of 1-500 nm and are dispersed with at least 0.001 parts by weight, based on the weight of the silica nano-particles, of a dispersing agent, the dispersing agent comprising:

(i) a branched oligomer having at least two reactive groups being reactive with the silica nano-particles; or (ii) a mixture of said oligomer of part (i) with (1) a low molecular weight coupling agent, (2) said film-forming polymer, or (3) a combination thereof;

whereby upon curing of the coating composition, silica nano-particle agglomerates are formed having a particle size of from 10 to 5000 nm.

Also disclosed is a process for forming a dispersion of silica nano-particles useful in clear coating compositions for vehicles and for the resulting coating composition containing the dispersion of the silica nano-particles.

The present invention also provides for a process for coating vehicle substrates with a clear coat to form clear coat/color coat finish using the above clear coating composition containing dispersed silica nano-particles to form a clear finish having good optical properties, i.e., good gloss and transparency and having enhanced scratch and mar resistance and low VOC (volatile organic content).

DETAILED DESCRIPTION OF THE INVENTION

The features and advantages of the present invention will be more readily understood, by those of ordinary skill in the art, from reading the following detailed description. It is to be appreciated those certain features of the invention, which are, for clarity, described above and below in the context of separate embodiments, may also be provided in combination in a single embodiment. Conversely, various features of the invention that are, for brevity, described in the context of a single embodiment, may also be provided separately or in any sub-combination. In addition, references in the singular may also include the plural (for example, "a" and "an" may refer to one, or one or more) unless the context specifically states otherwise.

The use of numerical values in the various ranges specified in this application, unless expressly indicated otherwise, are stated as approximations as though the minimum and maximum values within the stated ranges were both preceded by the word "about." In this manner, slight variations above and below the stated ranges can be used to achieve substantially the same results as values within the ranges. Also, the disclosure of these ranges is intended as a continuous range including every value between the minimum and maximum values.

All patents, patent applications and publications referred to herein are incorporated by reference in their entirety.

The term "binder" or "film-forming binder" as used herein refers to the film forming constituents of the composition, such as, film forming polymers and oligomers and includes any crosslinking agents, such as, polyisocyanates or melamines, and optionally other polymeric and/or oligomeric components, and optional reactive diluents. Organic liquid carriers, pigments, catalysts, antioxidants, U.V. absorbers, light stabilizers, leveling agents, antifoaming agents, anti-cratering agents and adhesion promoting agents are not included in the term.

Molecular weight (both number and weight average) is determined by gel permeation chromatography utilizing a high performance liquid chromatograph supplied by Hewlett-Packard, Palo Alto, Calif. and unless otherwise stated the liquid phase used was tetrahydrofuran and the standard used is polymethyl methacrylate or polystyrene.

"Tg" (glass transition temperature) is in ° C. and determined by Differential Scanning Calorimetry or calculated according to the Fox Equation.

The coating composition used in this invention preferably is a low VOC (volatile organic content) composition that is particularly suited for use as a clearcoat composition in automotive original equipment manufacturing (OEM) and in refinishing automobiles and trucks. The composition contains a film forming binder and an organic liquid carrier which is usually a solvent for the binder. In a low VOC composition, the amount of organic solvent used in the liquid carrier portion results in the composition having a VOC of less than 0.6 kilograms per liter (5 pounds per gallon) and preferably, in the range of about 0.25-0.53 kilograms per liter (2.1-4.4 pounds per gallon) of organic solvent, as determined under the procedure provided in ASTM D-3960. It should be noted that clear coat refers to the state of the dried and cured coating. It is possible that clear coat composition, as applied, is a milky, or transparent, opaque, or translucent solution, mixture, or dispersion. Also, clear coat compositions can optionally have a small amount of pigment present in order to tint the cured clear coat.

As used herein, the term 'substrate' means any surface made of materials such as metal, wood, resinous, asphalt, leather, paper, woven and nonwoven fabrics, metal, plaster, cement, paper, woven and nonwoven fabrics, metal, plaster, cementitious or any other surface, whether or not the surface was previously coated with the same or different coating composition. Previous coatings include, but are not limited to electrodeposition primer, a primer, a primer/sealer, or a pigmented coating.

Preferred substrates are automotive vehicle (or automobile) bodies, any and all items manufactured and painted by automobile sub-suppliers, frame rails, commercial trucks and truck bodies, including but not limited to beverage bodies, utility bodies, ready mix concrete delivery vehicle bodies, waste hauling vehicle bodies, and fire and emergency vehicle bodies, as well as any potential attachments or components to such truck bodies, buses, farm and construction equipment, truck caps and covers, commercial trailers, consumer trailers, recreational vehicles, including but not limited to, motor homes, campers, conversion vans, vans, pleasure vehicles, pleasure craft snow mobiles, all terrain vehicles, personal watercraft, motorcycles, boats, and aircraft. The substrate further includes industrial and commercial new construction and maintenance thereof; cement and wood floors; walls of commercial and residential structures, such office buildings and homes; amusement park equipment; concrete surfaces, such as parking lots and drive ways; asphalt and concrete road surface, wood substrates, marine surfaces; outdoor structures, such as bridges, towers; coil coating; railroad cars; printed circuit boards; machinery; OEM tools; signage; fiberglass structures; sporting goods (including uni-, bi-, tri-, and motor-cycles); and sporting equipment.

Typically, the coating composition has a film forming binder content of about 25-90% by weight and an organic liquid carrier content of about 10-75% by weight, preferably about 35-55% by weight binder and 45-65% by weight carrier.

Typically, the binder of the coating composition contains about 5-95% by weight of the film forming polymer and correspondingly, about 5-95% by weight of a crosslinking agent for the binder. Preferably the binder contains about 50-90% by weight of the film forming polymer and correspondingly, 10-50% by weight of a crosslinking agent for the binder. All of the above percentages are based on binder.

The coating composition contains about 0.1-20% by weight, based on the weight of the binder, of dispersed silica nano-particles and preferably, 0.5-10% by weight, based on the weight of the binder, of the silica nano-particles. After application of a layer of the coating composition to a substrate and curing of the composition, silica nano-particle agglomerates are formed in the cured finishing layer. The silica nano-particle agglomerates have a particle size of about 10-5000 nm, preferably 50-2000 nm for the longest dimension and are relatively uniformly dispersed in the cured layer. The presence of the silica nano-particle agglomerates provide the resulting cured finishing layer with mar and scratch resistance under both wet and dry conditions that show a significant improvement in scratch and mar resistance compared to coatings having unagglomerated silica nano-particles dispersed therein.

The silica nano-particles typically have a particle size of about 1-500 nm. The silica can be fumed silica, colloidal silica or amorphous silica. Typical commercially available silicas having the above nano-particle range are Aerosil R-972, Aerosil R-200, Aerosil R-812 from Degussa Inc, Nalco 1057 from Nalco Chemical Company, IPA-ST, IPA-ST-MS, IPA-ST-L, and IPA-ST-ZL from Nissan Chemical Company, Highlink NanO G-series from Clariant. It can be conventional that nano-particles obtained from commercial sources have been pre-treated to prevent agglomeration of the nano-particles. While such pre-treated particles are not required in the practice of the present invention, particles pre-treated in the conventional manner can be suitable for use herein.

The process for forming a dispersion of silica nano-particles comprising the steps:

(1) mixing silica nano-particles having a particle size of 1-500 nm with at least 0.001 parts by weight, based on the weight of the silica nano-particles, of a dispersing agent, the dispersing agent comprising:

(i) a branched or hyperbranched oligomer having at least two reactive groups being reactive with the silica nano-particles, or (ii) a mixture of the oligomers or part (i) with either (1) a film-forming polymer; (2) a low molecular weight coupling agent, or (3) a combination thereof;

thereby forming a dispersion of silica nano-particles.

Silica nano-particles can be used in the present invention without pre-treatment and/or without further treatment, but alternatively it can be the practice of the present invention to treat the nano-particles in a manner to provide reactive silyl groups, such as SiOH groups or reactive anhydrous $SiO_2$ groups, preferably on the surface of the particles and preferably prior to dispersing the nano-particles. Suitable reactive silane groups are hydrolyzable silyl groups of the general formula $[Y-Si(R)_nX_{3-n}]$, wherein: Y is either an organic or inorganic linking group that links the silicon atom to the silica nano-particle; n is 0, 1 or 2; R is oxysilyl or unsubstituted hydrocarbyl or hydrocarbyl substituted with at least one substituent containing a member selected from the group O, N, S, P, Si; and X is a hydrolyzable moiety selected from the group $C_1$ to $C_4$ alkoxy, $C_6$ to $C_{20}$ aryloxy, $C_1$ to $C_6$ acyloxy, hydrogen, halogen, amine, amide, imidazole, oxazolidinone, urea, carbamate, and hydroxylamine. Other types of groups, such as, hydroxyl groups, isocyanate groups, carboxylic acid, epoxy, unsaturated ethylene or vinyl groups, saturated hydrocarbon, acrylate or methacrylate groups can also be introduced onto the silica surface for the formulation of an agglomerate structure of the particles. Suitable organic linking groups can be substituted or unsubstituted aliphatic, cycloaliphatic, aromatic groups. Suitable inorganic linking groups can be titanates or zirconates. Such reactive silyl groups can be available to react with other chemical moieties dispersed with the nano-particles.

To form the dispersion, the silica nano-particles are contacted with at least 0.001 parts by weight, preferably with at least 0.003 to 3.000 parts by weight, based on the weight of the nano-particles, of a branched or hyperbranched oligomer having at least two groups that are reactive with the silica nano-particles. These reactive groups can be alkoxy, aryloxy, aclyoxy, hydrogen, halogen, amine, amid, imidazole, oxazolidinone, urea, carbamate, isocyanate, hydroxyl, hydroxyl amine, carboxylic acid, epoxy, vinyl groups, carbamate, silane groups, hydroxyl silane groups, alkoxy silane groups or any mixtures of these groups. A mixture of the above oligomer and a film-forming polymer; a low molecular weight coupling agent, or a combination thereof can also be used to contact the silica nano-particles.

Typically useful branched or hyperbranched oligomers have at least two reactive groups that can be silane, hydroxyl silane or alkoxy silane groups or a combination thereof. Useful oligomers also include trialkoxy silane oligomers. Examples of these include tris(trimethoxy silyl ethyl)cyclohexane, tris(triethoxy silyl ethyl)cyclohexane, silsesquioxanes, tris(3-(trimethyoxysily)propyl)isocyanurate, reaction products of oligomeric diols and polyols of linear aliphatic, polyester, polyether, star, branched and hyper-branched polyester with γ-isocyanatopropyltriethoxylsilane or γ-isocyanatopropyltrimethoxylsilane, hydrosilated vinyl containing oligomers with branched, star, and hyper-branched structures. Other useful oligomers are disclosed in Michaelczyk et al. U.S. Pat. No. 5,378,790 and U.S. Pat. No. 5,548,051, in Gregorovich et al. U.S. Pat. No. 6,268,456 and in Barsotti et al. EP 1054916 (B1) which is hereby incorporated by reference. Preferred silane oligomers have three active silane groups branched from aliphatic or siloxane rings.

The silica nano-particles can also be contacted with a mixture of the above oligomer and (1) a film-forming polymer and/or (2) a low molecular weight coupling agent. Suitable film-forming polymers can be chosen from the group polyacrylates, polyacrylourethanes, polyesters, branched copolyesters, polyurethanes, polyepoxides, and carbamate functional polymers or a mixture thereof provided that the film-forming polymers have functionality that is capable of reacting with the silica nano-particles. Suitable functional groups for the film-forming polymer can be chosen from hydroxyl groups, amino groups, carboxylic acids, epoxy groups, isocyanate groups, carbamate groups, silane groups, radically polymerizable ethylenically unsaturated groups or a mixture thereof. Preferably, the film-forming polymer has a molecular weight of greater than 1000.

Preferably, the film-forming polymer is a copolymer having silyl functionality, such as, for example, a polymer obtained by polymerization of: alkyl(meth)acrylate monomers; hydroxy alkyl(meth)acrylate and/or glycidyl methacrylate monomers; alkoxy silane monomers; and, optionally, styrene monomers. One preferred acrylosilane polymer comprises styrene/hydroxyl propyl acrylate/methacryloxypropyl trimethoxy silane/butyl acrylate/isobutyl methacrylate. Other useful silane containing polymers are shown in Hazan et al. U.S. Pat. No. 5,244,696 which is hereby incorporated by reference.

Also useful to form the nanosilica dispersions with the aforementioned branched or hyperbranched oligomers are low molecular weight coupling agents reactive with the silica nano-particles. These low molecular weight coupling agents generally have a molecular weight of less than 1000 and preferably also contain functional groups which can facilitate film-forming. Suitable functional groups are chosen from hydroxyl groups, amino groups, carboxylic acids, epoxy groups, carboxylic anhydrides, isocyanate groups, carbamate groups, carbonates, silane groups, radically polymerizable ethylenically unsaturated groups or a mixture thereof. Examples of low molecular weight coupling agents include 3-glycidoxypropylmeththyldiethoxysilane (Siquest WetLink™ 78 silane from GE Silicone), gamma-glycidoxypropyltrimethoxysilane (Silquest A-187 silane from GE Silicone), 3-triethoxysilylpropyl succinic acid anhydride (Geniosil GF20 from Wacker Silicones). Other suitable low molecular weight coupling agents contain hydroxy and silane groups. These can be produced through the reaction of oligomeric diols and polyols, such as, alkyl diols, triols, and polyols, polyester polyols, and polyether polyols (each optionally branched or hyperbranched), with isocyanato silane compounds such as, γ-isocyanatopropyltriethoxylsilane or γ-isocyanatopropyltrimethoxylsilane. Olefinically usaturated compounds containing suitable functional groups can also be used, for example, 2-vinylethyltrimethoxysilane, gamma-methacryloxypropyltrimethoxysilane, or hydroxy alkyl (meth)acrylates.

The inventive silica nano-particle dispersions are especially useful in coating compositions. When present, the dispersions provide enhanced scratch and mar resistance. Such coating compositions contain the silica nano-particle dispersions, a film forming binder, and organic liquid carrier.

The film forming binder of the coating composition comprises i) a film forming polymer having at least one reactive group selected from the following: hydroxyl group, amino group, isocyanate group, carbamate group, silane group, hydroxyl silane group, alkoxy silane group, epoxy group, carboxyl group, free radically polymerizable ethylenically unsaturated group or a combination thereof; and ii) at least one crosslinking agent reactive with the film forming polymer component.

Typical binders used in these compositions are acrylic polymers, such as, linear, branched, grafted, or segmented poly(meth)acrylates, meaning both polyacrylates and polymethacrylates, polyacrylourethanes, polyesters, branched copolyesters, oligomers, e.g., urethane oligomers, polyester urethanes, polyepoxides and carbamate functional polymers. Typical crosslinking agents that may be used in these compositions are polyisocyanates, blocked polyisocyanates, carboxylic acids, anhydrides or half esters, melamine crosslinking agents, alkylated melamines, silanes, benzoguanamines and other crosslinking agents known to those skilled in the art.

These acrylic polymer typically have a glass transition temperature (Tg) generally in the range of from −20° C. to 90° C. and preferably in the range of from about 0° C. to 30° C.

Other acrylic polymers used to form the coating compositions of this invention may be random polymers or structured copolymers, such as, block or graft copolymers. Particularly useful structured copolymers are the branched acrylics with segmented arms as disclosed in U.S. Ser. No. 10/983,462 filed Nov. 8, 2004 and U.S. Ser. No. 10/983,875 filed Nov. 8, 2004, both of which are incorporated herein by reference.

A block copolymer used in the present invention may have an AB diblock structure, or ABA or ABC triblock structure; for example, graft copolymers can be used in the present invention having a backbone segment and a side chain segment(s). Random copolymers that can be used have polymer segments randomly distributed in the polymer chain.

Acrylic AB, ABA or ABC block copolymers can be prepared by using a stepwise polymerization process such as anionic, group transfer polymerization (GTP) taught in U.S. Pat. No. 4,508,880, Webster et al., ""Living" polymers and process for their preparation", atom transfer radical polymerization (ATRP) taught in U.S. Pat. No. 6,462,125, White et al., and radical addition fragmentation transfer (RAFT) taught in U.S. Pat. No. 6,271,340, Anderson, et al. "Method of controlling polymer molecular weight and structure". Polymers so produced have precisely controlled molecular weight, block sizes and very narrow molecular weight distributions.

Graft copolymers may be prepared by a macromonomer approach using the special cobalt chain transfer (SCT) method reported in U.S. Pat. No. 6,472,463, Ma, the disclosure of which is herein incorporated by reference.

Random copolymers can be prepared using conventional free radical polymerization techniques as described in U.S. Pat. No. 6,451,950, Ma. The disclosure of which is herein incorporated by reference.

Typically useful acrylic polymers have a number average molecular weight of about 1,000 to 100,000, a Tg of −20 to 100° C. and contain moieties, such as, hydroxyl, carboxyl, glycidyl and silane groups. Typically useful acrylic polymers are known in the art and the following are typical examples of monomers used to form such polymers: linear alkyl (meth)acrylates having 1 to 12 carbon atoms in the alkyl group, cyclic or branched alkyl(meth)acrylates having 3 to 12 carbon atoms in the alkyl group including isobornyl(meth)acrylate, hydroxy alkyl(meth)acrylates having 1 to 4 carbon atoms in the alkyl group, glycidyl(meth)acrylate, hydroxy amino alkyl (meth)acrylates having 1 to 4 carbon atoms in the alkyl group, and the polymers can contain styrene, alpha methyl styrene, vinyl toluene, (meth)acrylonitrile(meth)acryl amides, (meth) acrylic acid, (meaning both acrylic acid and methacrylic acid), trimethylsilylpropyl(meth)acrylate, methacryloxypropyl trimethoxysilane and the like.

Examples of (meth)acrylic acid esters useful for forming these acrylic polymers are methyl acrylate, ethyl acrylate, isopropyl acrylate, tert-butyl acrylate, n-butyl acrylate, isobutyl acrylate, 2-ethylhexyl acrylate, lauryl acrylate, stearyl acrylate and the corresponding methacrylates. Examples of (meth)acrylic acid esters with cyclic alcohols are cyclohexyl acrylate, trimethylcyclohexyl acrylate, 4-tert.-butylcyclohexyl acrylate, isobornyl acrylate and the corresponding methacrylates.

Additional unsaturated monomers that do not contain additional functional groups useful for forming the (meth)acrylic polymers are, for example, vinyl ethers, such as, isobutyl vinyl ether and vinyl esters, such as, vinyl acetate, vinyl propionate, vinyl aromatic hydrocarbons, preferably those with 8 to 9 carbon atoms per molecule. Examples of such monomers are styrene, alpha-methylstyrene, chlorostyrenes, 2,5-dimethylstyrene, p-methoxystyrene, vinyl toluene. Styrene is preferably used.

Small proportions of olefinically polyunsaturated monomers may also be used. These are monomers having at least 2 free-radically polymerizable double bonds per molecule. Examples of these are divinylbenzene, 1,4-butanediol diacrylate, 1,6-hexanediol diacrylate, neopentyl glycol dimethacrylate, glycerol dimethacrylate.

Hydroxy-functional (meth)acrylic polymers generally are formed by free-radical copolymerization using conventional processes well known to those skilled in the art, for example, bulk, solution or bead polymerization, in particular by free-radical solution polymerization using free-radical initiators.

Suitable hydroxyl-functional unsaturated monomers that are used to introduce hydroxyl groups into the acrylic polymer are, for example, hydroxyalkyl esters of alpha, beta-olefinically unsaturated monocarboxylic acids with primary or secondary hydroxyl groups. These may, for example, comprise the hydroxyalkyl esters of acrylic acid, methacrylic acid, crotonic acid and/or isocrotonic acid. The hydroxyalkyl esters of (meth)acrylic acid are preferred. Examples of suitable hydroxyalkyl esters of alpha, beta-olefinically unsaturated monocarboxylic acids with primary hydroxyl groups are hydroxyethyl(meth)acrylate, hydroxypropyl(meth)acrylate, hydroxybutyl(meth)acrylate, hydroxyamyl(meth)acrylate and hydroxyhexyl(meth)acrylate. Examples of suitable hydroxyalkyl esters with secondary hydroxyl groups are 2-hydroxypropyl(meth)acrylate, 2-hydroxybutyl(meth)acrylate and 3-hydroxybutyl(meth)acrylate.

Preferred are hydroxy functional acrylic polymers having a hydroxy equivalent weight of 300 to 1300 and are polymers of hydroxy alkyl (meth)acrylates and one or more of the aforementioned monomers. The hydroxyl equivalent weight is the grams of resin per equivalent of hydroxyl groups. The following are typically preferred acrylic polymers: styrene/methyl methacrylate/isobutyl methacrylate/hydroxyethyl(meth) acrylate; styrene/methyl methacrylate/isobutyl methacrylate/ 2-ethylhexyl methacrylate/isobornyl methacrylate/hydroxyethyl(meth)acrylate and styrene/isobornyl methacrylate/2-ethylhexyl methacrylate/hydroxy propyl methacrylate/ hydroxyethyl(meth)acrylate. One particularly preferred hydroxy containing acrylic polymer contains 35 to 50 percent by weight styrene, 15 to 25 percent by weight ethylhexyl methacrylate and 15 to 20 percent by weight isobornyl methacrylate and 20 to 30 percent by weight hydroxyethyl methacrylate.

Additional useful hydroxy-functional unsaturated monomers are reaction products of alpha, beta-unsaturated monocarboxylic acids with glycidyl esters of saturated monocarboxylic acids branched in alpha position, for example with glycidyl esters of saturated alpha-alkylalkanemonocarboxylic acids or alpha,alpha'-dialkyalkanemonocarboxylic acids. These preferably comprise the reaction products of (meth) acrylic acid with glycidyl esters of saturated alpha,alpha-dialkylalkanemonocarboxylic acids with 7 to 13 carbon atoms per molecule, particularly preferably with 9 to 11 carbon atoms per molecule. These reaction products may be formed before, during or after the copolymerization reaction.

Further usable hydroxy-functional unsaturated monomers are reaction products of hydroxyalkyl(meth)acrylates with lactones. Hydroxyalkyl(meth)acrylates which may be used are, for example, those stated above. Suitable lactones are, for example, those that have 3 to 15 carbon atoms in the ring, wherein the rings may also comprise different substituents. Preferred lactones are gamma-butyrolactone, delta-valerolactone, epsilon-caprolactone, beta-hydroxy-beta-methyl-delta-valerolactone, lambda-laurolactone or mixtures thereof. Epsilon-caprolactone is particularly preferred. The reaction products preferably comprise those prepared from 1 mole of a hydroxyalkyl ester of an alpha,beta-unsaturated monocarboxylic acid and 1 to 5 moles, preferably on average 2 moles, of a lactone. The hydroxyl groups of the hydroxyalkyl esters may be modified with the lactone before, during or after the copolymerization reaction.

Suitable unsaturated monomers that can be used to provide the acrylic polymer with carboxyl groups are, for example, olefinically unsaturated monocarboxylic acids, such as, for example, acrylic acid, methacrylic acid, crotonic acid, isocrotonic acid, itaconic acid. Acrylic acid and methacrylic acid are preferably used.

Suitable unsaturated monomers that can be used to provide the acrylic polymer with glycidyl groups are, for example, allyl glycidyl ether, 3,4-epoxy-1-vinylcyclohexane, epoxycyclohexyl(meth)acrylate, vinyl glycidyl ether and glycidyl (meth)acrylate. Glycidyl(meth)acrylate is preferably used.

Free-radically polymerizable, olefinically unsaturated monomers which, apart from at least one olefinic double bond, do not contain additional functional groups that can be used to form the acrylic polymer are, for example, esters of unsaturated carboxylic acids with aliphatic monohydric branched or unbranched as well as cyclic alcohols with 1 to 20 carbon atoms. The unsaturated carboxylic acids, which may be considered, are acrylic acid, methacrylic acid, crotonic acid and isocrotonic acid. Esters of (meth)acrylic acid are preferred.

The acrylic polymer can contain (meth)acrylamides. Typical examples of such acrylic polymers are polymers of (meth) acrylamide and alkyl(meth)acrylates, hydroxy alkyl(meth) acrylates, (meth)acrylic acid and or one of the aforementioned ethylenically unsaturated polymerizable monomers.

One useful hydroxyl containing acrylic polymer is a blend of hydroxyl acrylic polymers comprising: about 5 to 50% by weight of a hydroxyl acrylic polymer having a weight average molecular weight of above 10,000 to 20,000; a second hydroxyl acrylic polymer (20 to 60% by weight) having a weight average molecular weight of above 7,000 up to 10,000; and a third hydroxyl acrylic polymer (20-70% by weight) having a weight average molecular weight of 2,000 up to 7,000, wherein the percentage of the three components of the blend of the hydroxyl acrylic polymers is equal to 100%.

Another useful hydroxyl containing acrylic polymer is obtained by polymerization of: from about 5-30% by weight styrene; 1-50% by weight of a first methacrylate, such as, methyl methacrylate and/or ethyl hexyl methacrylate; 30-60% by weight of a second methacrylate, such as, isobutyl or isobornyl methacrylate; and a hydroxy-alkyl methacrylate 10-40% by weight of. The weight percent basis is the total weight of the polymer (100%).

Still another useful acrylic polymer is obtained by polymerization of the following constituents in the percentage ranges given: styrene (5-30% by weight), methyl methacrylate (1-50% by weight), 2-ethyl hexyl methacrylate (1-50% by weight), isobutyl methacrylate (1-50% by weight) and hydroxy ethyl methacrylate (10-40% by weight). Another particularly preferred acrylic polymer contains the following constituents in the above percentage ranges: styrene (5-30% by weight), methyl methacrylate (1-50% by weight), isobutyl methacrylate (1-50% by weight), isobornyl methacrylate (1-50% by weight), 2-ethyl hexyl methacrylate (1-50% by weight), hydroxy ethyl methacrylate (10-40% by weight). Most preferably, compatible blends of two of the above acrylic polymers are used. Optionally, the acrylic polymer can include about 0.5-2% by weight of acrylamide or methacrylamide, such as, n-tertiary butyl acrylamide or methacrylamide.

Typically, the acrylic polymers are prepared by conventional solution polymerization techniques in which monomers, solvents and polymerization catalyst are charged into a conventional polymerization reactor and heated to about 60-200° C. for about 0.5-6 hours to form a polymer having a weight average molecular weight (Mw) of about 1,000-100,000, preferably, about 3,000-30,000.

Monomers that provide free radical polymerizable ethylenically unsaturated groups can also be used and can be present in the form of (meth)acrylol, vinyl, allyl, maleinate and/or fumerate groups. Typically useful radiation curable coating compositions that can be used are disclosed in Awokola et al. U.S. Pat. No. 6,740,365 B2 and U.S. Pat. No. 6,605,669 B2 which are hereby incorporated by reference.

Acrylic oligomers having a number average molecular weight of 300 to 3,000 of the aforementioned monomeric components also can be used as an optional polymeric component. Useful acrylic oligomers are disclosed in U.S. Publication No. 2004/0010091A1, published Jan. 15, 2004. By using monomers and reactants well known to those skilled in the art, these oligomers can have the one or more of the following groups that are reactive with isocyanate: hydroxyl, carboxyl, glycidyl, amine, aldimine, phosphoric acid and ketimine.

Acrylourethanes also can be used to form the novel coating composition of this invention. Typical useful acrylourethanes are formed by reacting the aforementioned acrylic polymers with an organic polyisocyanate. Generally, an excess of the acrylic polymer is used so that the resulting acrylourethane has terminal acrylic segments having reactive groups as described above. These acrylourethanes can have reactive end groups and/or pendant groups such as hydroxyl, carboxyl, glycidyl, silane or mixtures of such groups. Useful organic polyisocyanates are described hereinafter as the crosslinking agents but also can be used to form acrylourethanes useful in this invention. Typically useful acrylourethanes are disclosed in Stamegna et al. U.S. Pat. No. 4,659,780, which is hereby incorporated by reference.

Carbamate containing polymers that are useful in the coating composition are disclosed in U.S. Patent Application Publication 2003/0050388, which is hereby incorporated by reference and in particular discloses a carbamate polymer comprises the reaction product of an aliphatic polyisocyanate, a monohydric alcohol, a hydroxyfunctional aliphatic carboxylic acid and a polyalkylene ether glycol and has a number average molecular weight in the range of 100 to 2000. Other useful carbamate functional polymers are disclosed in Ramesh et al. U.S. Pat. No. 6,462,144 B1, which is hereby incorporated by reference and shows a carbamate functional polymer having a hyperbranched or star polyol core, a first chain extension based on a polycarboxylic acid or anhydride, a second chain extension based on an epoxy containing compound, and having carbamate functional groups on the core, the second chain extension or both. Acrylic polymers having primary functional carbamate functionality are useful and are disclosed in U.S. Pat. No. 5,866,259, which is hereby incorporated by reference.

Polyesters can also be used, such as, hydroxyl or carboxyl terminated or hydroxyl or carboxyl containing polyesters. The following are typically useful polyesters or ester oligomers: polyesters or oligomers of caprolactone diol and cyclohexane dimethylol, polyesters or oligomers of tris-hydroxy ethylisocyanurate and caprolactone, polyesters or oligomers of trimethylol propane, phthalic acid or anhydride and ethylene oxide, polyesters or oligomers of pentaerythritol, hexahydrophthalic anhydride and ethylene oxide, polyesters or oligomers of pentaerythritol, hexahydrophthalic anhydride and butylene oxide as disclosed in U.S. Pat. No. 6,221,484 B1.

The aforementioned polyesters and oligomers can be reacted with an organic isocyanate to form polyesterurethane polymers and oligomers that can be used in the novel composition.

One useful polyesterurethane that can used in the composition is formed by reacting an aliphatic polyisocyanate with an aliphatic or cycloaliphatic monohydric alcohol and subsequently reacting the resulting composition with a hydroxy functional aliphatic carboxylic acid until all of the isocyanate groups have been reacted. One useful polyurethane oligomer comprises the reaction product of the isocyanurate of hexane diisocyanate, cyclohexanol and dimethylol propionic acid.

Useful branched copolyesters polyols and the preparation thereof are described in WO 03/070843 published Aug. 28, 2003, which is hereby incorporated by reference.

The branched copolyester polyol has a number average molecular weight not exceeding 30,000, alternately in the range of from 1,000 to 30,000, further alternately in the range of 2,000 to 20,000, and still further alternately in the range of 5,000 to 15,000. The copolyester polyol has hydroxyl groups ranging from 5 to 200 per polymer chain, preferably 6 to 70, and more preferably 10 to 50, and carboxyl groups ranging from 0 to 40 per chain, preferably 1 to 40, more preferably 1 to 20 and most preferably 1 to 10. The Tg (glass transition temperature) of the copolyester polyol ranges from −70° C. to 50° C., preferably from −65° C. to 40° C., and more preferably from −60° C. to 30° C.

The branched copolyester polyol is conventionally polymerized from a monomer mixture containing a chain extender selected from the group consisting of a hydroxy carboxylic acid, a lactone of a hydroxy carboxylic acid and a combination thereof; and one or more hyper branching monomers.

The following additional ingredients can be included in the coating composition in the range of 50% to 95% by weight, all based on the weight of the binder of the coating composition.

Useful acrylic alkyd polymers having a weight average molecular weight ranging from 3,000 to 100,000 and a Tg ranging from 0° C. to 100° C. are conventionally polymerized from a monomer mixture that can include one or more of the following monomers: an alkyl(meth)acrylate, for example, methyl(meth)acrylate, butyl(meth)acrylate, ethyl(meth)acrylate, 2-ethyl hexyl(meth)acrylate; a hydroxy alkyl(meth) acrylate, for example, hydroxy ethyl(meth)acrylate, hydroxy propyl(meth)acrylate, hydroxy butyl(meth)acrylate; (meth) acrylic acid; styrene; and alkyl amino alkyl(meth)acrylate, for example, diethylamino ethyl(meth)acrylate or t-butyl aminoethyl methacrylate; and one or more of the following drying oils: vinyl oxazoline drying oil esters of linseed oil fatty acids, tall oil fatty acids or tung oil fatty acids.

One preferred polymer is polymerized from a monomer mixture that contains an alkyl(meth)acrylate, hydroxy alkyl acrylate, alkylamino alkyl acrylate and vinyl oxazoline ester of drying oil fatty acids.

Suitable iminiated acrylic polymers can be obtained by reacting acrylic polymers having carboxyl groups with an alkylene imine, such as, propylene imine.

Suitable cellulose acetate butyrates are supplied by Eastman Chemical Co., Kingsport, Tenn. under the trade names CAB-381-20 and CAB-531-1 and are preferably used in an amount of 0.1 to 20 percent by weight based on the weight of the binder.

A suitable ethylene-vinyl acetate co-polymer (wax) is supplied by Honeywell Specialty Chemicals—Wax and Additives, Morristown, N.J., under the trade name A-C® 405 (T) Ethylene-Vinyl Acetate Copolymer.

Suitable nitrocellulose resins preferably have a viscosity of about ½-6 seconds. Preferably, a blend of nitrocellulose resins is used. Optionally, the coating composition can contain ester gum and castor oil.

Suitable alkyd resins are the esterification products of a drying oil fatty acid, such as linseed oil and tall oil fatty acid, dehydrated castor oil, a polyhydric alcohol, a dicarboxylic acid and an aromatic monocarboxylic acid. Typical polyhydric alcohols that can be used to prepare the alkyd resin used in this invention are glycerine, pentaerythritol, trimethylol ethane, trimethylol propane; glycols, such as ethylene glycol, propylene glycol, butane diol and pentane diol. Typical dicarboxylic acids or anhydrides that can be used to prepare the alkyd resin are phthalic acid, phthalic anhydride, isophthalic acid, terephthalic acid maleic, and fumaric acid. Typical monocarboxylic aromatic acids are benzoic acid, paratertiary butylbenzoic acid, phenol acetic acid and triethyl benzoic acid. One preferred alkyd resin is a reaction product of an acrylic polymer and an alkyd resin.

Suitable plasticizers include butyl benzyl phthalate, dibutyl phthalate, triphenyl phosphate, 2-ethylhexylbenzyl phthalate, dicyclohexyl phthalate, diallyl toluene phthalate, dibenzyl phthalate, butylcyclohexyl phthalate, mixed benzoic acid and fatty oil acid esters of pentaerythritol, poly(propylene adipate) dibenzoate, diethylene glycol dibenzoate, tetrabutylthiodisuccinate, butyl phthalyl butyl glycolate, acetyltributyl citrate, dibenzyl sebacate, tricresyl phosphate, toluene ethyl sulfonamide, the di-2-ethyl hexyl ester of hexamethylene diphthalate, and di(methyl cyclohexyl)phthalate. One preferred plasticizer of this group is butyl benzyl phthalate.

If desired, the coating composition can include metallic driers, chelating agents, or a combination thereof. Suitable organometallic driers include cobalt naphthenate, copper naphthenate, lead tallate, calcium naphthenate, iron naphthenate, lithium naphthenate, lead naphthenate, nickel octoate, zirconium octoate, cobalt octoate, iron octoate, zinc octoate, and alkyl tin dilaurates, such as dibutyl tin dilaurate. Suitable chelating agents include aluminum monoisopropoxide monoversatate, aluminum(monoiospropyl)phthalate, aluminum diethoxyethoxide monoversatate, aluminum trisecondary butoxide, aluminum diisopropoxide monoacetacetic ester chelate and aluminum isopropoxide.

Also, polytrimethylene ether diols may be used as an additive having a number average molecular weight (Mn) in the range of from 500 to 5,000, alternately in the range of from 1,000 to 3,000; a polydispersity in the range of from 1.1 to 2.1 and a hydroxyl number in the range of from 20 to 200. The preferred polytrimethylene ether diol has a Tg of −75° C. Copolymers of polytrimethylene ether diols are also suitable. For example, such copolymers are prepared by copolymerizing 1,3-propanediol with another diol, such as, ethane diol, hexane diol, 2-methyl-1,3-propanediol, 2,2-dimethyl-1,3-propanediol, trimethylol propane and pentaerythritol, wherein at least 50 percent of the copolymer results from 1,3-propanediol. A blend of a high and low molecular weight polytrimethylene ether diol can be used wherein the high molecular weight diol has an Mn ranging from 1,000 to 4,000 and the low molecular weight diol has an Mn ranging from 150 to 500. The average Mn of the diol should be in the range of 1,000 to 4,000. It should be noted that, the polytrimethylene ether diols suitable for use in the present invention can include polytrimethylene ether triols and other higher functionality polytrimethylene ether polyols in an amount ranging from 1 to 20%, by weight, based on the weight of the polytrimethylene ether diol. It is believed that the presence of polytrimethylene ether diols in the crosslinked coating composition of this invention can improve the chip resistance of a coating resulting therefrom.

Additional details of the foregoing additives are provided in U.S. Pat. No. 3,585,160, U.S. Pat. No. 4,242,243, U.S. Pat. No. 4,692,481, and U.S. Re No. 31.309, which are incorporated therein by reference.

Crosslinking Agents

Typical crosslinking agents that can be used in the coating composition include organic polyisocyanates, blocked organic polyisocyanates, melamines, alkylated melamines, benzoquanamines, and silanes.

Typically useful organic polyisocyanates crosslinking agents that can be used in the novel composition of this invention include aliphatic polyisocyanates, cycloaliphatic polyisocyanates and isocyanate adducts. Typical polyisocyanates can contain within the range of 2 to 10, preferably 2.5 to 8, more preferably 3 to 5 isocyanate functionalities. Generally, the ratio of equivalents of isocyanate functionalities on the polyisocyanate per equivalent of all of the functional groups present ranges from 0.5/1 to 3.0/1, preferably from 0.7/1 to 1.8/1, more preferably from 0.8/1 to 1.3/1.

Examples of suitable aliphatic and cycloaliphatic polyisocyanates that can be used include the following: 4,4'dicyclohexyl methane diisocyanate, ("H$_{12}$MDI"), trans-cyclohexane-1,4-diisocyanate, 1,6-hexamethylene diisocyanate ("HDI"), isophorone diisocyanate, ("IPDI"), other aliphatic or cycloaliphatic di-, tri- or tetra-isocyanates, such as, 1,2-propylene diisocyanate, tetramethylene diisocyanate, 2,3-butylene diisocyanate, octamethylene diisocyanate, 2,2,4-trimethyl hexamethylene diisocyanate, dodecamethylene diisocyanate, omega-dipropyl ether diisocyanate, 1,3-cyclopentane diisocyanate, 1,2 cyclohexane diisocyanate, 1,4 cyclohexane diisocyanate, 4-methyl-1,3-diisocyanatocyclohexane, dicyclohexylmethane-4,4'-diisocyanate, 3,3'-dimethyl-dicyclohexylmethane 4,4'-diisocyanate, polyisocyanates having isocyanurate structural units, such as, the isocyanurate of hexamethylene diisocyanate and the isocyanurate of isophorone diisocyanate, the adduct of 2 molecules of a diisocyanate, such as, hexamethylene diisocyanate, uretidiones of hexamethylene diisocyanate, uretidiones of isophorone diisocyanate and a diol, such as, ethylene glycol, the adduct of 3 molecules of hexamethylene diisocyanate and 1 molecule of water, allophanates, trimers and biurets of hexamethylene diisocyanate, allophanates, trimers and biurets of isophorone.diisocyanate and the isocyanurate of hexane diisocyanate.

Tri-functional isocyanates also can be used, such as, Desmodur® N 3300, trimer of hexamethylene diisocyanate, Desmodur® 3400, trimer of isophorone diisocyanate, Desmodur® 4470 trimer of isophorone diisocyanate, these trimers are sold by Bayer Corporation. A trimer of hexamethylene diisocyanate sold as Tolonate® HDT from Rhodia Corporation is also suitable.

An isocyanate functional adduct can be used, such as, an adduct of an aliphatic polyisocyanate and a polyol. Also, any of the aforementioned polyisocyanates can be used with a polyol to form an adduct. Polyols, such as, trimethylol alkanes, particularly, trimethylol propane or ethane can be used to form an adduct.

One useful organic polyisocyanate component of the binder contains at least a portion of a trimer that is a timer of isophorone diisocyanate or a trimer of hexamethylene diisocyanate or a mixture of these two trimers. Preferably, the organic polyisocyanate component contains about 50%-100% by weight of a trimer of hexamethylene diisocyanate and about 0 to 50% by weight of a trimer of isophorone diisocyanate. More preferably, the organic polyisocyanate contains 50%-95% by weight of the trimer of hexamethylene diisocyanate (HDI) and 5%-50% of the trimer of isophorone diisocyanate (IPDI). The total percentage of polyisocyanates is equal to 100%.

By "trimer", it is meant that the isocyanate groups have been trimerized to form isocyanurate groups. Typically useful IPDI trimers are sold under the tradenames Desmodur® Z-4470 BA or SN/BA or SN or MPA/X. Typically useful HDI trimers are sold under the tradenames Desmodur® N-3300 or N-3390 or Tolonate® HDT or HDT-LV.

Up to 50% by weight of the polyisocyanate agent may be any of the conventional aromatic, aliphatic, cycloaliphatic diisocyanates, trifunctional isocyanates and isocyanate functional adducts of a polyol and a diisocyanate.

Isocyanate functional adducts can also be used that are formed from an organic polyisocyanate and a polyol. Any of the aforementioned polyisocyanates can be used with a polyol to form an adduct. Polyols, such as, trimethylol alkanes like trimethylol propane or ethane can be used. One useful adduct is the reaction product of tetramethylxylidene diisocyanate and trimethylol propane and is commercially available as Cythane® 3160.

Polyisocyanates containing heteroatoms in the residue linking the isocyanate groups can be used. Examples of these are polyisocyanates which comprise carbodiimide groups, allophanate groups, isocyanurate groups, urethane groups, acylated urea groups or biuret groups. These polyisocyanates have an isocyanate functionality higher than 2, for example, polyisocyanates of the uretidione or isocyanurate type produced by di- and/or trimerization of the aforementioned diisocyanates.

The melamine crosslinking agents are generally partially alkylated melamine formaldehyde compounds and may be monomeric or polymeric or mixtures thereof. Some of the suitable monomeric melamines include low molecular weight melamines which contain, on an average, three or more methylol groups etherized with a $C_1$ to $C_5$ monohydric alcohol, such as, methanol, n-butanol, or isobutanol per triazine nucleus, and have an average degree of condensation up to about 2 and preferably, in the range of about 1.1 to about 1.8, and have a proportion of mononuclear species not less than about 50 percent by weight. By contrast the polymeric melamines have an average degree of condensation of more than 1.9.

Some such suitable monomeric melamines include alkylated melamines, such as, methylated, butylated, isobutylated melamines and mixtures thereof. Many of these suitable monomeric melamines are supplied commercially. For example, Cytec Industries Inc., West Patterson, N.J. supplies Cymel® 301 (degree of polymerization of 1.5, 95% methyl and 5% methylol), Cymel® 350 (degree of polymerization of 1.6, 84 percent methyl and 16 percent methylol), 303, 325, 327 and 370, which are all monomeric melamines. Suitable polymeric melamines include high amino (partially alkylated) melamine known as Resimene® BMP5503 (molecular weight 690, polydispersity of 1.98, 56 percent butyl, 44 percent amino), which is supplied by Solutia Inc., St. Louis, Mo., or Cymel®1158 provided by Cytec Industries Inc., West Patterson, N.J. Cytec Industries Inc. also supplies Cymel® 1130 @80 percent solids (degree of polymerization of 2.5), Cymel® 1133 (48 percent methyl, 4 percent methylol and 48 percent butyl), both of which are polymeric melamines.

If desired, appropriate catalysts may also be included in the activated compositions to accelerate the curing process of a potmix of the coating composition.

When the activated compositions include melamine as the crosslinking agent, it also preferably includes a catalytically active amount of one or more acid catalysts to further enhance the crosslinking of the components on curing. Generally, catalytically active amount of the acid catalyst in the coating composition ranges from about 0.1 percent to about 5 percent, preferably ranges from 0.1 percent to 2 percent, more preferably ranges from 0.5 percent to 1.2 percent, all in weight percent based on the weight of the binder. Some suitable acid catalysts include aromatic sulfonic acids, such as, dodecylbenzene sulfonic acid, para-toluenesulfonic acid and dinonylnaphthalene sulfonic acid, all of which are either unblocked or blocked with an amine, such as, dimethyl oxazolidine and 2-amino-2-methyl-1-propanol, n,n-dimethylethanolamine or a combination thereof. Other acid catalysts that can be used, such as phosphoric acids, more particularly, phenyl acid phosphate, benzoic acid, oligomers having pendant acid groups, all of which may be unblocked or blocked with an amine.

When the activated compositions include a polyisocyanate as the crosslinking agent, the coating composition preferably includes a catalytically active amount of one or more tin or tertiary amine catalysts for accelerating the curing process. Generally, the catalytically active amount of the catalyst in the coating composition ranges from about 0.001 percent to about 5 percent, preferably ranges from 0.005 percent to 2 percent, more preferably, ranges from 0.01 percent to 1 percent, all in weight percent based on the weight of the binder. A wide variety of catalysts can be used, such as, tin compounds, including dibutyl tin dilaurate and dibutyl tin diacetate; tertiary amines, such as, triethylenediamine. These catalysts can be used alone or in conjunction with carboxylic acids, such as, acetic acid. One of the commercially available catalysts, sold under the trademark, Fastcat® 4202 dibutyl tin dilaurate by Elf-Atochem North America, Inc. Philadelphia, Pa., is particularly suitable.

Epoxy-acid coating compositions are also useful as the film forming polymers of the present invention. Typical epoxy-acid coating compositions contain an epoxy or a polyepoxy group containing compound or polymer and they also contain a compound or a polymer that has at least one, preferably at least two carboxyl groups. The carboxyl groups can be in the form of free carboxylic acids, carboxylic acid anhydrides, or mixtures thereof. Examples of such epoxy acid coatings can be found in U.S. Pat. No. 6,146,703 and in U.S. Pat. No. 6,743,867 both of which are herein incorporated by reference.

Organic Liquid Carrier

The liquid carrier medium comprises an organic solvent or blend of solvents. The selection of organic solvent depends upon the requirements of the specific end use application of the coating composition of this invention, such as the VOC emission requirements, the selected pigments, binder and crosslinking agents.

Representative examples of organic solvents which are useful herein include alcohols, such as, methanol, ethanol, n-propanol, and isopropanol; ketones, such as, acetone, butanone, pentanone, hexanone, and methyl ethyl ketone, methyl isobutyl ketone, diisobutyl ketone, methyl amyl ketone; alkyl esters of acetic, propionic, and butyric acids, such as, ethyl acetate, butyl acetate, and amyl acetate; ethers, such as, tetrahydrofuran, diethyl ether, and ethylene glycol and polyethylene glycol monoalkyl and dialkyl ethers, such as, cellosolves and carbitols; and glycols, such as, ethylene glycol and propylene glycol and mixtures thereof, and aromatic hydrocarbon solvents, such as, xylene, toluene. Typically, aqueous carriers comprise water and a blend of organic solvents suited for the requirements of the coating composition.

Catalysts

The coating composition also can contain a sufficient amount of catalysts to cure the composition at ambient temperatures. Typically useful catalysts include organotin compounds, such as, organotin carboxylates, particularly dialkyl tin carboxylates of aliphatic carboxylic acids, such as, dibutyl tin dilaurate (DBTDL), dibutyl tin dioctoate, dibutyl tin diacetate, and the like. Although not preferred, any of the other customary organotin or organometallic (Zn, Cd, Pb) catalysts could also be used. The amount of organotin catalyst employed in the coating composition can vary considerably depending on the specific binder system and the degree of initial hardness desired. Generally, about 0.005-0.2% by weight, based on the weight of the binder, of organotin catalyst will be sufficient to impart the desired properties.

Tertiary amines can be used as co-catalyst that include tertiary aliphatic monoamines or diamines, particularly trialkylene diamines, such as, triethylene diamine (DABCO), N-alkyl trimethylenediamine, such as, N,N,N'-trimethyl-N'- tallow-1,3-diaminopropane, and the like; and trialkylamines, such as, tridodecylamine, trihexadecylamine, N,N'-dimethylalkyl amine, such as, N,N'-dimethyidodecyl amine, and the like. The alkyl or alkylene portions of these amines may be linear or branched and may contain 1-20 carbon atoms. Especially preferred are amines that contain at least 6 carbon atoms in at least one of their alkyl or alkylene portions to lower the hazing in humid conditions.

As with the amount of organotin compound, the amount of tertiary amine employed in the coating composition can vary considerably, it being required only that tertiary amine be present in an amount which, together with the above, will cause the composition to cure at ambient temperatures.

An organic acid can also be included in the catalyst system for increased pot life. Typically useful acid catalysts are formic acid, acetic acid, propionic acid, butanoic acid, hexanoic acid, and any other aliphatic carboxylic acid, and the like. Generally, about 0.005-1% by weight, based on the weight of the binder, of acid catalyst is employed.

Calcium and zinc organic acid salts are optionally included in the catalyst system. Typically useful are calcium acetate, zinc acetate, calcium oxalate, zinc oxalate, calcium adipate, zinc adipate and the like. Generally, when used, about 0.005-1% by weight, based on the weight of the binder, of the calcium and/or zinc organic acid salt is used.

It has been found that the catalyst package described above offers a higher cure response than tin, amine, acid or acid salt alone.

Additives

To improve weatherability of the composition about 0.1-10% by weight, based on the weight of the binder, of ultraviolet light stabilizers, screeners, quenchers and antioxidants can be added. Typical ultraviolet light screeners and stabilizers include the following:

Benzophenones, such as, hydroxy dodecyloxy benzophenone, 2,4-dihydroxy benzophenone, hydroxy benzophenones containing sulfonic acid groups and the like.

Benzoates, such as, dibenzoate of diphenylol propane, tertiary butyl benzoate of diphenylol propane and the like.

Triazines, such as, 3,5-dialkyl-4-hydroxyphenyl derivatives of triazine, sulfur containing derivatives of dialkyl-4-hydroxy phenyl triazine, hydroxy phenyl-1,3,5-triazine and the like.

Triazoles, such as, 2-phenyl-4-(2,2'-dihydroxy benzoyl)-triazole, substituted benzotriazoles such as hydroxy-phenyltriazole and the like.

Hindered amines, such as, bis(1,2,2,6,6 entamethyl-4-piperidinyl sebacate), di[4(2,2,6,6,tetramethyl piperidinyl)]sebacate and the like and any mixtures of any of the above.

Generally, flow control agents are used in the composition in amounts of about 0.1-5% by weight, based on the weight of the binder, such as polyacrylic acid, polyalkylacrylates, polyether modified dimethyl polysiloxane copolymer and polyester modified polydimethyl siloxane.

Application

Generally, the coating composition of this invention is primarily used as a clear coat in automotive finishing and in refinishing vehicles. However, the coating composition can contain pigments to provide a mon-coat, base coat, sealer coat, primer, primer surfacer or other pigmented coating composition. Pigments are added to the coating composition in a pigment to binder ratio of about 0.1:100 to 300:100 as are commonly used for the aforementioned compositions. Pigments typically are formulated into mill bases compatible with the coating composition and are added in the desired amount. Pigments used are those that are typically used for the aforementioned compositions and are well known to those skilled in the art.

"One-pack coating composition" means a curable coating composition having both the crosslinkable component and the crosslinking agent stored together in one pack. The crosslinking agent of this composition is selected from the group consisting of blocked polyisocyanates, melamines, alkylated melamines, benzoquanamines, and silanes, or a combination thereof. Typical blocking agents for polyisocyanates include alcohols, ketimines, and oximes. One-pack coating compositions are applied to a suitable substrate and are cured at elevated temperatures to form a durable coating.

The coating composition of this invention can be prepared as a "two-component" or "two-pack" coating composition, wherein the crosslinkable components and the crosslinking agents are stored in separate containers, which are typically sealed. The catalyst, organic solvent, and usual other additives may be added to either or both the hydroxyl or crosslinking agents, depending upon the intended use of the composition. However, these additives (except for some solvent) are preferably added to and stored in the same container with the hydroxyl component. The contents of the hydroxyl and isocyanate component containers are mixed in the desired NCO/OH ratio just prior to use to form the activated coating composition, which has a limited pot life. Mixing is usually accomplished simply by stirring at room temperature just before application. The coating composition is then applied as a layer of desired thickness on a substrate surface, such as an autobody. After application, the layer dries and cures to form a coating on the substrate surface having the desired coating properties.

In the application of the coating composition as a clear coat refinish to a vehicle such as an automotive or a truck, the basecoat which may be either a solvent based composition or a waterborne composition is first applied and then dried to at least remove solvent or water before the clear coat is applied usually wet-on-wet by conventional spraying. Electrostatic spraying also may be used. In refinish applications, the composition is preferably dried and cured at ambient temperatures but can be forced dried and cured in paint booths equipped with heat sources at slightly elevated booth temperatures of, in general, about 30-100° C., preferably, about 35-65° C., for a short time of about 3-30 minutes, preferably about 5-15 minutes. The coating so formed is typically about 0.5-5 mils thick.

The coating composition of this invention can be used in OEM truck, automobile and vehicle part manufacturing or to repair a variety of substrates such as previously painted metal substrates, cold roll steel, steel coated with conventional primers, such as, electrodeposition primers, alkyd resin repair primers and the like, plastic type substrates, such as, polyester reinforced fiber glass, reaction injection molded urethanes and partially crystalline polyamides, as well as wood and aluminum substrates.

The present invention is further defined in the following Examples. It should be understood that these Examples are given by way of illustration only. The present invention is not limited by the illustrative examples set forth herein below, but rather is defined by the claims contained herein below.

All parts and percentages are on a weight basis unless otherwise indicated.

All molecular weights are determined by GPC using a polymethyl methacrylate standard.

Abbreviations that are used in the following Examples:

pbw—parts by weight

MW—weight average molecular weight

MAK—methyl amyl ketone

FT IR—Fourier Transform Infrared Spectroscopy

Gen 4ES Clear Coat—RKA00103, commercially available from E.I. DUPONT DE NEMOURS AND COMPANY, Wilmington, Del. Etch resistant clear coat based on acrylosilane-melamine crosslinking chemistry prepared according to the teachings of Hazan et al. U.S. Pat. No. 5,244,696.

Nalco 1057—untreated colloidal silica nano-particles from Nalco Chemical Company having a particle size of 20 nm dispered in propoxyethanol.

IPA-ST—untreated colloidal silica nano-particles from Nissan Chemical Company having a particle size of 10-15 nm and dispersed in isopropanol.

PA-ST-MS—untreated colloidal silica nano-spheres from Nissan Chemical Company having a particle size of 17-23 nm dispersed in isopropanol.

Unless otherwise specified, all chemicals are available from the Aldrich Chemical Company, Milwaukee, Wis.

EXAMPLES

The following compositions were prepared for use in the coating compositions of the examples:

Preparation of Silane Polymer 1

Acrylosilane polymer solutions were prepared by copolymerizing in the presence of a 2/1 Solvesso® 100 Aromatic Solvent/butanol mixture, monomer mixtures of 25 pbw styrene (S), 20 pbw hydroxypropyl acrylate (HPA), 30 pbw methacryloxypropyl trimethoxy silane (MAPTS) (Silquest® A-174 from Crompton), 2 pbw butyl acrylate (BA), and 23 pbw isobutyl methacrylate (IBMA) in the presence of 8 parts by weight of Vazo®67 [2,2'azobis(2-methylbutyronitrile)] (available from DuPont, Wilmington, Del.). The resulting acrylosilane polymer solution has a 71% solids content and a viscosity of F-R on the Gardner Holdt scale measured at 25° C. The polymer has a weight average molecular weight of approximately 4,500 gram/mole.

Preparation of Silane Oligomer 1

Silane Oligomer 1 was prepared in accordance with the description of Example 30 of U.S. Pat. No. 5,378,790, substituting trimethoxy silane for the triethoxy silane used in Example 30.

Preparation of OH-Containing Containing Carbamate Silane Oligomers for Use in Silica Dispersion Preparation Preparation of Carbamate Silane Oligomer Control To a mixture of 16.8 grams of 3-isocyanatopropyl-1-trimethoxysilane (Silquest® A-Link 35 from GE silicone), 25 grams of methyl amyl ketone (MAK), and 0.002 gram of dibutyl tin dilaurate was added 8.8 grams of hydroxy propyl carbamate. The mixture was heated for 16 hours at 43° C., and then cooled to room temperature. The completion of the reaction was determined by FT-IR by the disappearance of the NCO absorption peak at the 2278 cm$^{-1}$. The resulting solution had a solids content of 50%.

Preparation of Carbamate Silane Oligomer 1

An organic dimer diol, PRIPOL® 2033 (from Unichema International having an OH value of 195-206), was mixed with MAK, 0.01% of dibutyl tin dilaurate, and 3-isocyanato-propyl-1-trimethoxysilane (Silquest® A-Link 35 from GE silicone) in NCO:OH molar ratio of 1:2. The mixture was heated for 16 hours at 43° C., and then cooled to room temperature. The completion of NCO—OH reaction was determined by FT-IR on the disappearance of NCO absorption peak at the 2278 cm$^{-1}$. The resulting oligomer solution had a 50% solids content.

Preparation of Carbamate Silane Oligomer 2

A polyether diol of 1,3-propane diol (PO3G) was prepared according to U.S. Pat. No. 6,905,765 for a molecular weight of about 700. This polyether diol was mixed with MAK, 0.01% of dibutyl tin dilaurate, and 3-isocyanatopropyl-1-trimethoxysilane (Silquest® A-Link 35 from GE silicone) in NCO:OH molar ratio of 1:2. The reaction was stirred for 16 hours at 43° C., and then cooled to room temperature. The endpoint of the reaction was determined by the disappearance of the NCO absorption peak at 2278 cm$^{-1}$ as determined by FT-IR. The resulting oligomer had a solids content of 50%.

Preparation of Carbamate Silane Oligomer 3

A polyether diol of 1,3-propane diol (PO3G) was prepared according to U.S. Pat. No. 6,905,765 for a molecular weight of about 2104. This polyether diol was mixed with MAK, 0.01% of dibutyl tin dilaurate, and 3-isocyanatopropyl-1-trimethoxysilane (Silquest® A-Link 35 from GE silicone) in NCO:OH molar ratio of 1:2. The reaction was stirred for 16 hours at 43° C., and then cooled to room temperature. The endpoint of the reaction was determined by the disappearance of the NCO absorption peak at 2278 cm$^{-1}$ as determined by FT-IR. The resulting oligomer had a solids content of 50%.

Preparation of Carbamate Silane Oligomer 4

A polyether diol of 1,3-propane diol (PO3G) was prepared according to U.S. Pat. No. 6,905,765 for a molecular weight of about 2104. This polyether diol was mixed with MAK, 0.01% of dibutyl tin dilaurate, and 3-isocyanatopropyl-1-trimethoxysilane (Silquest® A-Link 35 from GE silicone) in NCO:OH molar ratio of 1:1. The reaction was stirred for 16 hours at 43° C., and then cooled to room temperature. The endpoint of the reaction was determined by the disappearance of the NCO absorption peak at 2278 m$^{-1}$ as determined by FT-IR. The resulting oligomer had a solids content of 50%.

Preparation of Carbamate Silane Oligomer 5

Silquest® A-1170 [bis(trimethoxysilylpropyl)amine] was mixed with MAK, 0.01% of dibutyl tin dilaurate, and 3-isocyanatopropyl-1-trimethoxysilane (Silquest® A-Link 35 from GE silicone) in NCO:NH molar ratio of 1:1. The mixture was heated for 16 hours at 43° C., and then cooled to room temperature. The endpoint of the reaction was determined by the disappearance of the NCO absorption peak at 2278 cm$^{-1}$ as determined by FT-IR. The resulting oligomer had a solids content of 50%.

Table 1 compares the compositions of the carbamate silane oligomers used to form the silica dispersions.

TABLE 1

|  | Carbamate Silane Olig. 1 | Carbamate Silane Olig. 2 | Carbamate Silane Olig. 3 | Carbamate Silane Olig. 4 | Carbamate Silane Olig. 5 |
| --- | --- | --- | --- | --- | --- |
| Diol or amine | PRIPOL ® | PO3G 700 MW | PO3G 2104 MW | PO3G 2104 MW | SILQUEST ® A-1170 |
| NCO:OH/NH | 1:2 | 1:2 | 1:2 | 1:1 | 1:1 |

Preparation of Control Dispersions 1-4 and Dispersions 5-13

To a 60 ml glass bottle was added the ingredients (in parts by weight) of Table 2, portion 1 with mixing. This mixture was placed in an oven at 60° C. for 16 hours without stirring. After cooling to room temperature, the ingredient of Table 2, portion 2 was added, if applicable. For each dispersion wherein silane polymer 1 was added, the dispersion was heated for an additional 16 hours at 60° C. without stirring and then cooled to room temperature and stored for further use.

Table 2 below summarizes the preparation dispersion 1-13 for incorporation into clear coating compositions.

TABLE 2

| | | Ctrl Dis 1 | Ctrl Dis 2 | Ctrl Dis 3 | Ctrl Dis 4 | Disp 5 | Dis 6 | Dis 7 | Dis 8 | Dis 9 | Dis 10 | Dis 11 | Dis 12 | Dis 13 |
|---|---|---|---|---|---|---|---|---|---|---|---|---|---|---|
| 1 | Nalco 1057 | 30 | 30 | 30 | 30 | 30 | 30 | 30 | 30 | 30 | 30 | 30 | | 30 |
| | IPA-ST | | | | | | | | | | | | 30 | |
| | Water | 0.3 | | | | | | | | | | | | |
| | Carbamate silane oligomer control | 1.8 | 12 | | | | | | | | | | | |
| | Carb/Si Olig 1 | | | 12 | | | | | | | | | | |
| | Carb/Si Olig 2 | | | | 12 | | | | | | | | | |
| | Carb/Si Olig 3 | | | | | 12 | | | | | | | | |
| | Carb/Sil Olig 4 | | | | | | 12 | | | | | | | |
| | Carb/Si Olig 5 | | | | | | | 0.015 | | | | | | |
| | Silane Poly 1 | | | | | | | | 7.5 | | | | | |
| | Silane Olig 1 | | | | | | | | | 0.015 | 12 | 18 | 12 | |
| | Silsesquioxane[1] | | | | | | | | | | | | | 12 |
| 2 | Silane Poly 1 | 0 | 0 | 0 | 0 | 0 | 0 | 7.5 | 0 | 7.5 | 7.5 | 0 | 7.5 | 0 |

[1]Silsesquioxane - silane oligmer from Dow Corning having the tradename Z-6018

Examples A-P

Clearcoat Control Composition (Coating Example A)

Gen 4ES clearcoat (available from DuPont, Wilmington, Del.) was reduced with 10% wt of ethyl 3-ethoxy propionate (EEP).

Formulation of Clearcoat Compositions Incorporating above Prepared Dispersions, Coating Examples B-P To form clear coating compositions, the aforementioned dispersions were added to 210 grams of Gen 4 Clearcoat according to Table 3 (all amounts shown in Table 3 are in parts by weight). The resulting mixture was stirred for 30 minutes and reduced with 10% wt of ethyl 3-ethoxy propionate (EEP). Table 3 summarizes the preparation of clear coating compositions A-P that were prepared and then applied as a clear coat and tested for and scratch and mar resistarice. In Examples O and P, the clear coating compositions did not contain a dispersion of the present invention.

TABLE 3

| | Ctrl. CC Ex. A | Ctrl. CC Ex. B | Ctrl. CC Ex. C | Ctrl. CC Ex. D | Ctrl. CC Ex. E | CC Ex. F | CC Ex. G | CC Ex. H | Ctrl. CC Ex. I | CC Ex. J | CC Ex. K | CC Ex. L | CC Ex. M | CC Ex. N | Ctrl CC Ex. O | Ctrl CC Ex P |
|---|---|---|---|---|---|---|---|---|---|---|---|---|---|---|---|---|
| Gen 4 CC | 210 | 210 | 210 | 210 | 210 | 210 | 210 | 210 | 210 | 210 | 210 | 210 | 210 | 210 | 210 | 210 |
| Ctrl Dis 1 | | 32.1 | | | | | | | | | | | | | | |
| Ctrl Dis 2 | | | 42 | | | | | | | | | | | | | |
| Ctrl Dis 3 | | | | 42 | | | | | | | | | | | | |
| Ctrl Dis 4 | | | | | 42 | | | | | | | | | | | |
| Dis 5 | | | | | | 42 | | | | | | | | | | |
| Dis 6 | | | | | | | 42 | | | | | | | | | |
| Dis 7 | | | | | | | | 37.5 | | | | | | | | |
| Dis 8 | | | | | | | | | 37.5 | | | | | | | |
| Dis 9 | | | | | | | | | | 48 | | | | | | |
| Dis 10 | | | | | | | | | | | 49.5 | | | | | |
| Dis 11 | | | | | | | | | | | | 49.5 | | | | |
| Dis 12 | | | | | | | | | | | | | 49.5 | | | |
| Dis 13 | | | | | | | | | | | | | | 42 | | |
| Nalco 1057 | | | | | | | | | | | | | | | 30 | |
| Silane Olig 1 | | | | | | | | | | | | | | | 18 | |
| Polysioxane | | | | | | | | | | | | | | | | 0.15 |

Polysiloxane—Dow Corning 57 Additive

Each of the above coating examples A-P were reduced to a spray viscosity with conventional solvents and each was hand sprayed to a thickness of about 50 microns onto a panel coated with a solvent-borne black base-coat over a steel substrate which was already coated with a layer each of electrocoat and primer surfacer. The solvent-borne basecoat is an Ebony basecoat commercially available from DuPont under DuPont Code of 648S42728. The primer surfacer used is commercially available from DuPont under DuPont Code of 554-DN082. The electrocoat used is commercially available from DuPont under the name of ED5050.

The basecoats were applied in two coats by hand with a 60 second flash period between the first and the second coat over a primed, electrocoated steel substrate. The spray booth conditions were 24° C. and 55% humidity. After a 4-minute flash following the second basecoat application, two layers of the clearcoat compositions with a 30 second flash between the first and the second clearcoat application. The booth conditions remained the same. The clearcoats were further flashed for 10 minutes and then baked in an oven for 20 minutes at 140° C.

For scratch and mar resistance tests, the panels were allowed to age for at least 24 hours. Crockmeter dry mar and wet mar test were run according to a procedure published in U.S. Pat. No. 6,379,807. The properties of coatings were measured and reported in the following Table 4.

ability by themselves. On the other hand, as shown in Table 4, excellent incorporation of silica nano-particles did not necessarily lead to improved scratch and mar resistance. Although coating example F showed excellent incorporation with no increase of haze, its dry mar and wet mar resistance was almost identical to the control coating example A to which silica nano-particles were not added. By contrast, moderate improvement of wet mar resistance was observed in coating examples G and H, whose coupling agents contain 2 or 3 silane groups, which are capable of coupling to 2 to 3 particles. Such results indicate some level of particle agglomeration was beneficial for improved mar resistance.

Coating example I used a hydroxyl containing silane polymer as coupling agent, with OH groups capable of crosslink to the melamine crosslinkers. Transmission electron microscopy revealed that the nano-particles were well dispersed in the clearcoat matrix and few of the particles were agglomerated. However, scratch and mar test showed that such an example with particles well dispersed in the film showed little improvement of scratch and mar resistance.

Moderate improvement of wet mar resistance was achieved when a trace amount of tris(2-trimethoxysilylethyl) cyclohexane was added during the preparation of the dispersion sample (coating example J).

Significant improvement of both dry and wet mar resistance was achieved when larger amounts of tris(2-trimethoxysilylethyl) cyclohexane was used for the dispersion prepa-

TABLE 4

|  | % Particle Added by Binder | Carbamate/ Urea Eq. Wt* | 20 Gloss | 2° Haze | Crockmeter- Dry Mar | Crockmeter- Wet Mar |
| --- | --- | --- | --- | --- | --- | --- |
| C. Ex. A | 0% | NA** | 89 | 0.14 | 94% | 78% |
| C. Ex. B | 7% | 308 | <60 | 8.29 | NA | NA |
| C. Ex. C | 7% | 308 | <60 | 7.76 | NA | NA |
| C. Ex. D | 7% | 763 | 72 | 0.94 | NA | NA |
| C. Ex. E | 7% | 905 | 75 | 0.63 | NA | NA |
| Ex. F | 7% | 2309 | 89 | 0.1 | 94% | 80% |
| Ex. G | 7% | 1257 | 90 | 0.07 | 94% | 84% |
| Ex. H | 7% | 564 | 89 | 0.1 | 94% | 85% |
| Ex. I | 7% | NA | 88 | 0.14 | 94% | 79% |
| Ex. J | 7% | NA | 88 | 0.13 | 94% | 84% |
| Ex. K | 7% | NA | 82 | 0.14 | 99% | 93% |
| Ex. L | 7% | NA | 82 | 0.14 | 97% | 92% |
| Ex. M | 7% | NA | 87 | 0.13 | 91% | 91% |
| Ex. N | 7% | NA | 86 | 0.15 | 95% | 91% |
| C. Ex. O | 7% | NA | <70 | ** | NA | NA |
| C. Ex. P | 0% | NA | 89 | 0.16 | 98% | 70% |

*Equivalent weight of carbamate (—O—C(O)NH—) functionality in the dispersing coupling agent, grams/mole. In coating examples I-P* the coupling agents do not contain carbamate or urea functionality.
**Seeding and haze in coating.

Table 4 shows, from coating examples B to G, how well silica particles were incorporated into the clearcoat. This was dependent on the equivalent weight or molar concentration of hydrogen bond forming carbamate functionality in the coupling agent. The higher the equivalent weight, or lower molar concentration of the carbamate groups in the coupling agent, the better the silica particles were incorporated into the clearcoat. Excellent incorporation was achieved with the carbamate functionality having an Eq. Wt higher than 1000 grams/mole. Such a result suggests that the minimization of inter-particle hydrogen bonding is essential to achieve excellent incorporation of the silica particles into clearcoat without causing haze. However, as coating example H demonstrates, excellent incorporation may still be achieved with the low carbamate Eq. Wt (Eq. Wt<1000) coupling agents, if it were used at a low quantity and also in combination with other coupling agents which demonstrated good incorporating ration, along with the OH-containing silane polymer 1 (Coating example K). Transmission electron microscope showed that agglomeration of silica nano-particles was formed throughout the bulk interior and also the surface of the coatings. The agglomerates in the bulk interior adopted various morphologies with their longest dimensions in the range of 100-1000 nm, mostly 150-500 nm, while the shortest dimensions in the range of 50-200 nm. These composite films still showed excellent transparency or low haze, partly due to the close match of refractive index of the particles with the clearcoat substrate. The significant mar improvement of this example is due to a close match of the agglomerate dimensions with the sizes of local deformation in the coatings created by plastic deformation or film fracture as a result of scratching, as indicated by nano-scratch analysis. The formation of agglomerates with of tris(2-trimethoxysilylethyl) cyclohexane suggests that silane oligomers with branched or hyperbranched structures would be desired to encourage agglomerate formation and mar resistance improvement.

Coating example L showed that tris(2-trimethoxysilylethyl)cyclohexane alone could achieve significant improvement of mar improvement for both dry mar and wet mar tests. Coating example M, however, showed a significant improvement of wet mar but not dry mar. The difference was due to the use of IPA-ST nano-particles. The IPA-ST was smaller (10-13 nm) and differently prepared to possess a larger surface area from Nalco 1057 (about 20 nm). The transmission electron microscope (TEM) analysis for coating example M showed the particles were agglomerated into larger more branched morphologies than dimensions with Nalco 1057, throughout the films (>1000 nm) but no significant nano-particle agglomeration occurred near the surface region (<100 nm down from the air surface). Since dry mar tests are used to test the surface region's mar resistance as demonstrated by the high gloss retention, it explains why these types of composite coatings would not have an improved dry mar resistance. However, for wet mar, since the abrasives run deep into the bulk of the coatings interior (>100 nm from the top of the surface of the coating), the crack propagation stopping mechanism of the agglomerates still is taken into effect. Thus, significantly improved wet mar resistance was still observed.

Coating example M showed that silsesquioxane could also help to improve the dry mar and wet mar resistance of the clearcoat. The working mechanism is theorized to be the same as that of the tris(2-trimethoxysilylethyl)cyclohexane, as the silanol groups in the silsesquioxane are also sterically-hindered enough to enable them to couple to different particles, not like the silane polymer where all functionality may condense onto the same particle due to the chain flexibility of the acrylic polymers and no agglomerates can be formed.

Coating example O showed that post addition of the Nalco 1057 and tris(2-trimethoxysilylethyl)cyclohexane separately into the coating formulation resulted in poor incorporation of the silica nano-particles and showed significant haze caused by seeding out of the particles. While coating example P showed that addition of polysiloxane could significantly improve the dry mar resistance, it had a limited effect on the wet mar resistance, which indicates that merely fortifying the surface of a coating with nano-particles does not sufficiently improve the mar resistance under conventional use conditions where wet mar resistance is an important characteristic.

All the silane oligomers or polymers used to treat the silica surface were tested for mar improvement by free addition in the Gen 4 clear, in equivalent amount to what brought in by the nano-particle dispersions. None of them showed any significant mar improvement over the Gen 4 control. Free-adding silane oligomers, in particular such as tris(2-trimethoxysilylethyl)cyclohexane, were subjected to material loss during the bake, due to their low molecular weight and also low reactivity towards the film forming reaction.

Coating Examples Q-T

Examples of Silica Nano Dispersions in Carbamate-Melamine Based Clears

The following resin examples were prepared for use in clearcoat preparation.
Carbamate Oligomer A carbamate functional oligomer was prepared by charging the following ingredients into a reaction flask equipped with a heating mantle, stirrer, thermometer, nitrogen inlet and a reflux condenser:

|  | Parts by Weight |
|---|---|
| Portion I | |
| Ethyl 3-ethoxy propionate | 796 |
| Isocyanurate of hexane diisocyanate (Desmodur ® 3300 from Bayer Corporation) | 1738 |
| Dibutyl tin dilaurate | 0.1 |
| Portion II | |
| Ethyl 3-ethoxy propionate | 41 |
| Iso-butanol | 577 |
| Portion III | |
| Pripol 2033 dimer diol (from Unichema International, hydroxy value of 196-206) | 319 |
| Portion IV | |
| Butanol | 41 |
| Total | 3512 |

Portion I was pre-mixed and charged into the reaction flask and heated to 100° C. under agitation and a nitrogen blanket. Then Portion II was added over a 90-minute period, in order to keep the exotherm temperature at or below 120° C. Immediately following, Portion III was added over a period of 15 minutes at 120° C. The reaction mixture was then held at 120° C. while mixing until essentially all of the isocyanate was reacted as indicated by infrared scan. After NCO in the IR absorbance plot is no longer detected, the reaction mixture was cooled to below 100° C. and Portion IV was then added to adjust the solids content of the resulting solution to 75%.

The following clearcoat (CC) examples were prepared by adding the silica dispersion 10 (previously prepared). As shown on Table 5, all amounts are in parts by weight:

TABLE 5

|  | Ctrl CC Ex. Q | CC Ex. R | CC Ex. S | CC Ex. T |
|---|---|---|---|---|
| NAD[1] | 5.4 | 5.4 | 5.4 | 5.4 |
| Resimene ® 4514[2] | 23.6 | 23.6 | 23.6 | 23.6 |
| Butanol | 4 | 4 | 4 | 4 |
| Tinuvin ® 928[3] | 1.4 | 1.4 | 1.4 | 1.4 |
| Tinuvin ® 123[4] | 0.7 | 0.7 | 0.7 | 0.7 |
| Solvesso ® 100 | 5.5 | 5.5 | 5.5 | 5.5 |
| Amine-Blocked DDBSA[5] | 1.9 | 1.9 | 1.9 | 1.9 |
| Flow Additive[6] | 0.5 | 0.5 | 0.5 | 0.5 |
| RCA[7] | 5.4 | 5.4 | 5.4 | 5.4 |
| Carbamate Oligomer | 51 | 51 | 51 | 51 |
| Dispersion 10 |  | 20 | 11 | 5.7 |

[1]NAD - Non-aqueous dispersion resin (NAD) prepared in accordance with the procedure described in the U.S. Pat. No. 5,747,590 at column 8, lines 46-68 and column 9, lines 1-25, all of which is incorporated herein by reference.
[2]Resimine ® 4514 - melamine formaldehyde resin from Ineous Melamines.
[3]Tinuvin ® 928 - benzotriazole UV screener from Ciba Specialty Chemical Company.
[4]Tinuvin ® 123 - hindered amine light stabilizer from Ciba Specialty Chemical Company.
[5]Dodecylbenzyl sulfonic acid at 33.6% blocked with diisopropanol amine by 1:1.1 stoichiometry in butanol.
[6]Flow Additive - Disparon LC-955 from King Industries.
[7]Aerosil ® R-805 grind in acrylic polyol (BMA/HPA 60/40), at 9% by wt.

Each of the above clear coatings was reduced to 35 seconds by #4 Ford cup with ethyl 3-ethoxy propionate and hand sprayed to a coating thickness of about 50 microns onto separate steel panels coated with a solvent-borne Ebony black base-coat over a steel substrate which was already coated with a layer each of electro-coat and primer surfacer both described in coating example A.

The basecoat and clear coat were applied and baked according to the procedure described in coating example A. All the baked samples were allowed to age for at least 24 hours. Crockmeter dry mar and wet mar test were run according to a procedure described in coating example A. The performance of each clear is reported in the following Table 6.

TABLE 6

| | Added % Silica by Binder | 20° Gloss | 2° Haze | Crockmeter-Dry Mar | Crockmeter-Wet Mar |
|---|---|---|---|---|---|
| C. Ex. Q | 0 | 93 | 0.12 | 92% | 83% |
| Ex. R | 7% | 88 | 0.13 | 98% | 90% |
| Ex. S | 3.5% | 93 | 0.13 | 98% | 88% |
| Ex. T | 2% | 92 | 0.1 | 97% | 86% |

The data in Table 6 shows that improved mar resistance is achieved in clear coats based on carbamate-melamine crosslinking, with the silica addition as low as 2-3.5%. TEM analysis again showed silica nano-particles are locally agglomerated, with many adopting chain-type morphology where their chain lengths are in the order of 1500 nm or less, and width in the order 500 nm or less (mostly around 100-300 nm). Some of these agglomerates are also stratified to the surface, with about 20% of surface coverage at 7% of silica add, 10% of surface coverage at 3.5% of silica add, and less than 2% of surface coverage at 2% of silica add.

Examples U-X

Fumed Silica Examples Showing Improved Scratch and Mar Resistance Preparation of Fumed Silica Grind 1

To a mixing container equipped with a Cowes blade, was added 80.6 grams of Solvesso® 100, 253 grams of acrylic polyol (STY/BMA/BA/HPA) in a ratio of 15/30/17/38). The above mixture was mixed for 30 minutes and 57.7 grams of Aerosil® R-972 fumed silica particles were added in portions. The resulting mixture was agitated until all the particles were dispersed. The resulting dispersion was milled with a 0.8-1.0 mm Zirconia (zirconium oxide) with a media load of 1135 grams for 33 minutes at 2200 rpm to give a clear dispersion.
Preparation of Fumed Silica Grind 2
To a mixing container equipped with a Cowes blade, was added 106.2 grams of AROMATIC® 100, 169.1 grams of Silane Polymer 1 (prepared in Example 1). The above mixture was mixed for 30 minutes and 38.6 grams of Aerosil® R-972 fumed silica particles were added in portions. The resulting mixture was agitated until all the particles were dispersed. The resulting dispersion was milled with a 0.8-1.0 mm Zirconia (zirconium oxide) with a media load of 1135 grams for 33 minutes at 2200 rpm to give a clear dispersion.
Preparation of Fumed Silica Grind 3
To a mixing container equipped with a Cowes blade, was added 138 grams of AROMATIC® 100, 50.2 grams of Silane Polymer 1, and 68.7 grams of tris(2-trimethoxysilylethyl) cyclohexane. The above mixture was mixed for 30' and was added in portions with 68.7 grams of Aerosil® R-972 fumed silica particles. The resulting mixture was agitated until all the particles were dispersed. The resulting dispersion was milled with a 0.8-1.0 mm Zirconia (zirconium oxide) with a media load of 1135 grams for 33 minutes at 2200 rpm to give a clear dispersion.
Preparation of Clear Coating Compositions U-X
The following Table 7 summarizes the preparation of clear coatings for testing for scratch and mar resistance.

TABLE 7

| | Ctrl CC Ex. U | CC Ex. V | CC Ex. W | CC Ex. X |
|---|---|---|---|---|
| Silane Polymer 1 | 60 | 56 | 56 | 60 |
| Acrylic Polyol[8] | 3 | | | |
| Blocked Iso[9] | 17 | 17 | 17 | 17 |
| Tinuvin® 928 | 2 | 2 | 2 | 2 |
| Tinuvin® 123 | 1 | 1 | 1 | 1 |
| Butanol | 4 | 4 | 4 | 4 |
| Solvesso® 100 | 8 | 8 | 8 | 8 |
| Flow additive[10] | 0.6 | 0.6 | 0.6 | 0.6 |
| Amine Blocked DDBSA | 1 | 1 | 1 | 1 |
| Silsesquioxane[11] | 11 | 11 | 11 | 11 |
| NAD | 5 | 5 | 5 | 5 |
| Fumed Silica Grind 1 | | 20.3 | | |
| Fumed Silica Grind 2 | | | 20.3 | |
| Fumed Silica Grind 3 | | | | 14.2 |

[8]Acrylic polyol was prepared by copolymerizing in the presence of Solvesso® 100 aromatic, 15 parts by weight of styrene (STY), 30 parts by weight butyl methacrylate (BMA), 17 parts by weight butyl acrylate (BA), 38 parts by weight hydroxyl propyl acrylate (HPA) in the presence of 0.75 parts by weight of t-butyl peroxyacetate. The resulting polymer had a weight average molecular weight of 5000 at 71% solids content.
[9]Blocked Iso - Desmodur ® VP LS2253 from Bayer Material Science.
[10]Flow Additive - Disparon LC-955 from King Industries.
[11]Silsesquioxane - silane oligmer from Dow Corning having the tradename Z-6018.

Each of the above clear coatings was reduced to 35 seconds by #4 Ford cup with ethyl 3-ethoxy propionate and hand sprayed to a coating thickness of about 50 microns onto separate steel panels coated with a waterborne black basecoat (under Dupont code of 686S40343, commercially available from DuPont) over a steel substrate which was already coated with a layer each of electro-coat and primer surfacer both described in coating example A.

The basecoat and clear coat were applied and baked according to the procedure described in coating example A.

For scratch and mar resistance tests, all the baked samples were allowed to age for at least 24 hours. Fracture energy, and plastic and after-fracture deformation were measured by the nano-scratch test described in coating example A. Crockmeter dry mar and wet mar test were run according to a procedure described in coating example A. The properties of each of the clear coatings were measured and reported in the following Table 8.

TABLE 8

| | VOC at Spray | 20° Gloss | 2° Haze | Crockmeter-Dry Mar | Crockmeter-Wet Mar | Fracture Energy, (mN) | Plastic Deformation, (micron) |
|---|---|---|---|---|---|---|---|
| C. Ex. U | 0.46 | 92 | 0.1 | 75% | 59% | 9.3 | 0.39 |
| Ex. V | 0.48 | 91 | 0.1 | 78% | 59% | 7.5 | 0.38 |
| Ex. W | 0.45 | 91 | 0.11 | 75% | 55% | 9.0 | 0.41 |
| Ex. X | 0.44 | 91 | 0.11 | 83% | 76% | 9.1 | 0.34 |

VOC—volatile organic content kg/l.

Fracture Energy and after fracture Plastic Deformation were measured by a nano-scratch test method published by Ford Motor Company (PA-0171).

As Table 8 shows, grinding of the fumed silica with a typical acrylic polyol (coating example V) didn't show a significant improvement of the scratch and mar, and significantly increased the paint VOC. While, grinding of the fumed silica particles with a typical silane polymer (coating example W) maintained the VOC at spray, but the scratch and mar resistance of the coating was not improved at all. Only the grinding with the presence of the branched silane oligomer (coating example X) significantly improved the mar and also reduced the VOC of the system. Nano-scratch analysis showed that plastic deformation of coating example X was largely reduced and the size of deformation was reduced in the regions where the coatings were fractured. TEM analysis showed that all of the samples, which were added with the fumed silica, contained agglomerates throughout the bulk interior of the coatings, the silica nano-particle were not more concentrated in the surface region. Coating example V and coating example W contained typically loose agglomerates at dimensions of around 1000 nm. While, coating example X contained smaller, more condensed agglomerates at dimensions of 100-300 nm. Results of coating example X also showed that significant improvement of dry mar and wet mar resistance can be achieved without surface stratification of the silica particles.

Examples Y-AA

Nano Particles Showing Improved Scratch and Mar Resistance for Epoxy-Acid Clear Coat Preparation of Dispersion 14: Epoxy-Containing Silica Dispersion To a 60 ml glass bottle was added 10 grams of Nalco 1057, 4 grams of tris(2-trimethoxysilylethyl)cyclohexane, and 1 gram of gamma-glycidoxypropyltrimethoxysilane with mixing. This mixture was placed in an oven at 60° C. for 16 hours without stirring, cooled to room temperature and stored for further use.

Preparation of Clear coat for Mar Resistance Testing

An Epoxy-Acid based clearcoat (Kino 1200th clearcoat, RK-8139, commercially available from DuPont, Wilmington, Del.) was reduced with 10% wt of 1/1 mixture of ARO-MATIC® 100 and dibasic ester-DBE (from Invista Inc.) and used as a control clear. To this epoxy-acid control clear was added Fumed Silica Grind 3 or the epoxy-functional Dispersion 14 to make the clear compositions described in Table 9.

TABLE 9

|  | Ctrl CC Ex. Y | CC Ex. Z | CC Ex. AA |
|---|---|---|---|
| Epoxy-Acid Control Clear | 100 | 100 | 100 |
| Fumed Silica Grind 3 |  | 20 |  |
| Dispersion 14 |  |  | 13 |

Each of the above clear coatings was hand sprayed to a coating thickness of about 50 microns onto separate steel panels coated with a waterborne black base-coat (under Dupont code of 686S40343, commercially available from DuPont) over a steel substrate which was already coated with a layer each of electro-coat and primer surfacer both described in coating example A.

The basecoat and clear coat were applied and baked according to the procedure described in coating example A.

All the samples were tested for crockmeter-dry and wet mar resistance by methods described in coating example A. Panels were also tested for appearance which was measured by QMS (Quality Measurement Systems from Autospec America) which provides a combined measurement of gloss, distinctness of image, and orange peel. Typical QMS numbers for automotive finishes are 45-80 with higher numbers meaning better appearance.

The data is summarized in Table 10.

TABLE 10

|  | 20° Gloss | 2° Haze | Crockmeter- Dry Mar | Crockmeter- Wet Mar | QMS |
|---|---|---|---|---|---|
| C. Ex. Y | 86 | 0.13 | 73% | 35% | 80 |
| Ex. Z | 85 | 0.14 | 89% | 71% | 77 |
| Ex. AA | 86 | 0.13 | 90% | 70% | 81 |

As Table 10 shows, both clear coat Z and AA showed significant dry mar and wet mar resistance improvement. While these two dispersions showed equivalent improvement of mar resistance, clearcoat M containing Dispersion 14 showed better appearance by both QMS and visual assessment.

What is claimed is:

1. A coating composition comprising
   a) a film-forming polymer having at least one reactive group selected from the group consisting of hydroxyl, isocyanate, carbamate, silane, hydroxyl silane, alkoxy silane, epoxy, carboxyl, free radically polymerizable ethylenically unsaturated group and a combination thereof;
   b) at least one crosslinking agent that is reactive with the film-forming polymer;
   c) an organic liquid carrier; and
   d) 0.1 to 20 percent by weight, based on the weight of the film-forming polymer, of dispersed silica nano-particles, wherein the silica nano-particles have a particle size of 1-500 nm and are dispersed with at least 0.001 parts by weight, based on the weight of the silica nano-particles, of a dispersing agent, the dispersing agent consists of:
      (i) tris(trimethoxy silyl ethyl) cyclohexane or tris(triethoxy silyl ethyl) cyclohexane, or
      (ii) a mixture of part (i) with either (1) the film-forming polymer; (2) a low molecular weight coupling agent, or (3) a combination thereof;
   wherein after application of a layer of the coating composition to a substrate and curing of the coating composition, silica nano-particle agglomerates are formed that are dispersed throughout the bulk of the coating composition.

2. The coating composition of claim 1 wherein the nano-particles, prior to being dispersed, are treated to provide the surface of the silica nanoparticle with reactive silane groups of the formula $[Y—Si(R)_n X_{3-n}]$ wherein:
   Y is an organic or inorganic linking group that links the silica atom to the silica nano-particle;
   n is 0, 1 or 2
   R is oxysilyl or unsubstituted hydrocarbyl or hydrocarbyl substituted with at least one substituent containing a member selected from the group O, N, P, Si; and
   X is a moiety selected from the group consisting of C1 to C4 alkoxy, C6 to C20 aryloxy, C1 to C6 acyloxy, hydrogen, halogen, amine, amide, imidazole, oxazolidinone, urea, hydroxylamine, or carbamate groups.

3. The coating composition of claim 1 having a VOC content of less than about 0.6 kg/l.

4. The coating composition of claim 1 further comprising a pigment wherein said pigment is present in a pigment to binder ratio of about 0.1:100 to 300:100.

5. The coating composition of claim 1 wherein the film forming polymer comprises a hydroxy acrylo silane polymer or an epoxy acrylosilane polymer.

6. The coating composition of claim 1 wherein the silica nano-particles are dispersed with a mixture of a trialkoxy silane oligomer and either a hydroxy acrylosilane polymer or an epoxy acrylosilane polymer.

7. The coating composition of claim 1 wherein said low molecular weight coupling agent is gamma-glycidyloxypropyltrimethoxysilane or 3-glycidoxypropylmethyldiethoxysilane.

8. The coating composition of claim 1 wherein the silica nano-particles are selected from the group consisting of fumed silica, colloidal silica, and amorphous silica.

9. The coating composition of claim 1 wherein the silica nano-particles have reactive SiOH groups or anhydrous $SiO_2$ groups.

10. The coating composition of claim 1 wherein said composition is waternborne or solvent borne.

11. A process for coating vehicle substrates with a clear coat to form clear coat/color coat finish, said process comprising applying a layer of a coating composition to a substrate, followed by drying and curing of said layer, wherein the coating composition comprises:
   a) a film-forming polymer having at least one reactive group selected from the group consisting of hydroxyl, isocyanate, carbamate, silane, hydroxyl silane, alkoxy silane, epoxy, carboxyl, free radically polymerizable ethylenically unsaturated group and a combination thereof;
   b) at least one crosslinking agent that is reactive with the film-forming polymer;
   c) an organic liquid carrier; and
   d) 0.1 to 20 percent by weight, based on the weight of the film-forming polymer, of dispersed silica nano-particles, wherein the silica nano-particles have a particle size of 1-500 nm and are dispersed with at least 0.001 parts by weight, based on the weight of the silica nano-particles, of a dispersing agent, the dispersing agent consists of:
      (i) tris(trimethoxy silyl ethyl) cyclohexane or tris(triethoxy silyl ethyl) cyclohexane, or
      (ii) a mixture of part (i) with either (1) the film-forming polymer; (2) a low molecular weight coupling agent, or (3) a combination thereof;
   wherein after the application of the layer of the coating composition to the substrate and curing of the layer of the coating composition, silica nano-particle agglomerates are formed that are dispersed throughout the bulk of the coating composition.

12. The process of claim 11 wherein said drying and said curing is performed in one step.

13. The process of claim 11 wherein a basecoat having a waterbased or an organic based medium is first applied to said substrate.

14. The process of claim 13 wherein said application of the coating composition is done by electrostatic or conventional spraying.

* * * * *